United States Patent
Lee

(10) Patent No.: US 10,685,914 B2
(45) Date of Patent: Jun. 16, 2020

(54) SEMICONDUCTOR DEVICE AND MANUFACTURING METHOD THEREOF

(71) Applicant: SK hynix Inc., Gyeonggi-do (KR)

(72) Inventor: Ki Hong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/983,682

(22) Filed: May 18, 2018

(65) Prior Publication Data

US 2019/0067182 A1    Feb. 28, 2019

(30) Foreign Application Priority Data

Aug. 31, 2017  (KR) ................. 10-2017-0110971
Feb. 26, 2018  (KR) ................. 10-2018-0023081

(51) Int. Cl.
| | | |
|---|---|---|
| *H01L 23/528* | (2006.01) | |
| *H01L 23/532* | (2006.01) | |
| *H01L 23/535* | (2006.01) | |
| *H01L 29/06* | (2006.01) | |
| *H01L 21/768* | (2006.01) | |
| *H01L 21/762* | (2006.01) | |
| *H01L 21/311* | (2006.01) | |
| *H01L 27/24* | (2006.01) | |
| *H01L 45/00* | (2006.01) | |
| *H01L 27/11526* | (2017.01) | |

(Continued)

(52) U.S. Cl.
CPC ...... *H01L 23/528* (2013.01); *H01L 21/31116* (2013.01); *H01L 21/762* (2013.01); *H01L 21/76802* (2013.01); *H01L 21/76877* (2013.01); *H01L 23/535* (2013.01); *H01L 23/53295* (2013.01); *H01L 27/1157* (2013.01); *H01L 27/11519* (2013.01); *H01L 27/11524* (2013.01); *H01L 27/11526* (2013.01); *H01L 27/11565* (2013.01); *H01L 27/11573* (2013.01); *H01L 27/249* (2013.01); *H01L 27/2436* (2013.01); *H01L 29/0649* (2013.01); *H01L 45/06* (2013.01); *H01L 45/10* (2013.01); *H01L 45/1226* (2013.01); *H01L 27/11556* (2013.01); *H01L 27/11582* (2013.01); *H01L 27/2454* (2013.01)

(58) Field of Classification Search
None
See application file for complete search history.

(56) References Cited

U.S. PATENT DOCUMENTS 9,190,150 B2 * 11/2015 Sakanushi ........... H01L 29/7926
9,941,009 B2 *  4/2018 Lim ....................... G11C 5/025
(Continued)

FOREIGN PATENT DOCUMENTS

KR   1020110080134   7/2011
KR   1020150116995   10/2015
(Continued)

*Primary Examiner* — Nishath Yasmeen
(74) *Attorney, Agent, or Firm* — IP & T Group LLP

(57) ABSTRACT

A semiconductor device includes a wiring structure, a stacked structure located over the wrong structure, channel structures passing through the stacked structure, contact plugs passing through the stacked structure and electrically connected to the wiring structure, and insulating spacers each including loop patterns surrounding a sidewall of each of the contact plugs and stacked along the side all of each of the contact plugs.

15 Claims, 40 Drawing Sheets

(51) Int. Cl.
*H01L 27/11565* (2017.01)
*H01L 27/11519* (2017.01)
*H01L 27/11524* (2017.01)
*H01L 27/11573* (2017.01)
*H01L 27/1157* (2017.01)
*H01L 27/11556* (2017.01)
*H01L 27/11582* (2017.01)

(56) References Cited

U.S. PATENT DOCUMENTS

| | | | | |
|---|---|---|---|---|
| 2010/0038699 | A1* | 2/2010 | Katsumata | H01L 27/11578 |
| | | | | 257/324 |
| 2015/0162342 | A1* | 6/2015 | Lee | H01L 29/66833 |
| | | | | 257/324 |
| 2015/0325588 | A1* | 11/2015 | Lee | H01L 27/11573 |
| | | | | 257/329 |
| 2016/0300848 | A1* | 10/2016 | Pachamuthu | H01L 21/768 |
| 2017/0047344 | A1* | 2/2017 | Lee | H01L 27/11573 |
| 2017/0179154 | A1* | 6/2017 | Furihata | H01L 27/11524 |

FOREIGN PATENT DOCUMENTS

| | | |
|---|---|---|
| KR | 1020160018921 | 2/2016 |
| KR | 1020160069903 | 6/2016 |

* cited by examiner

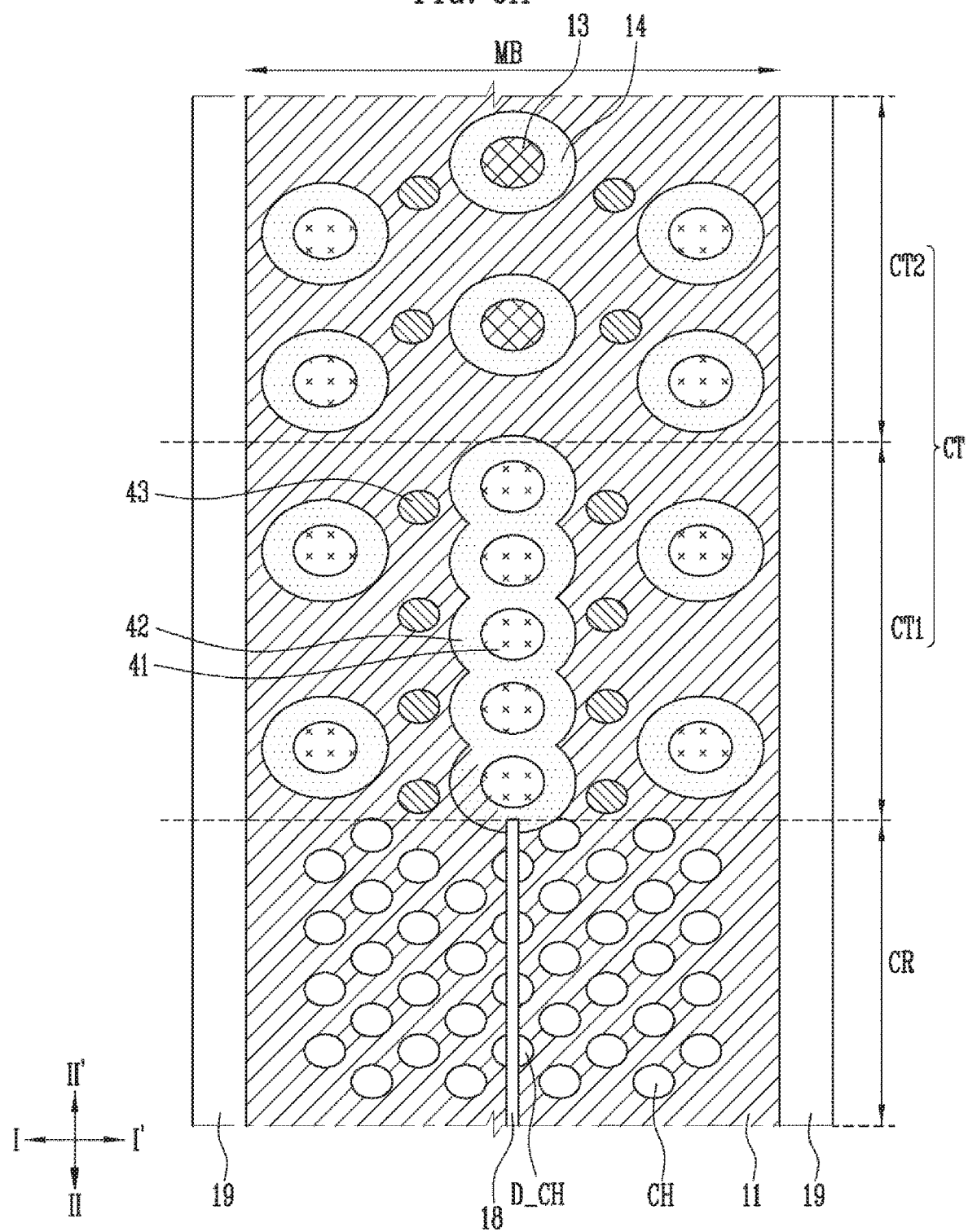

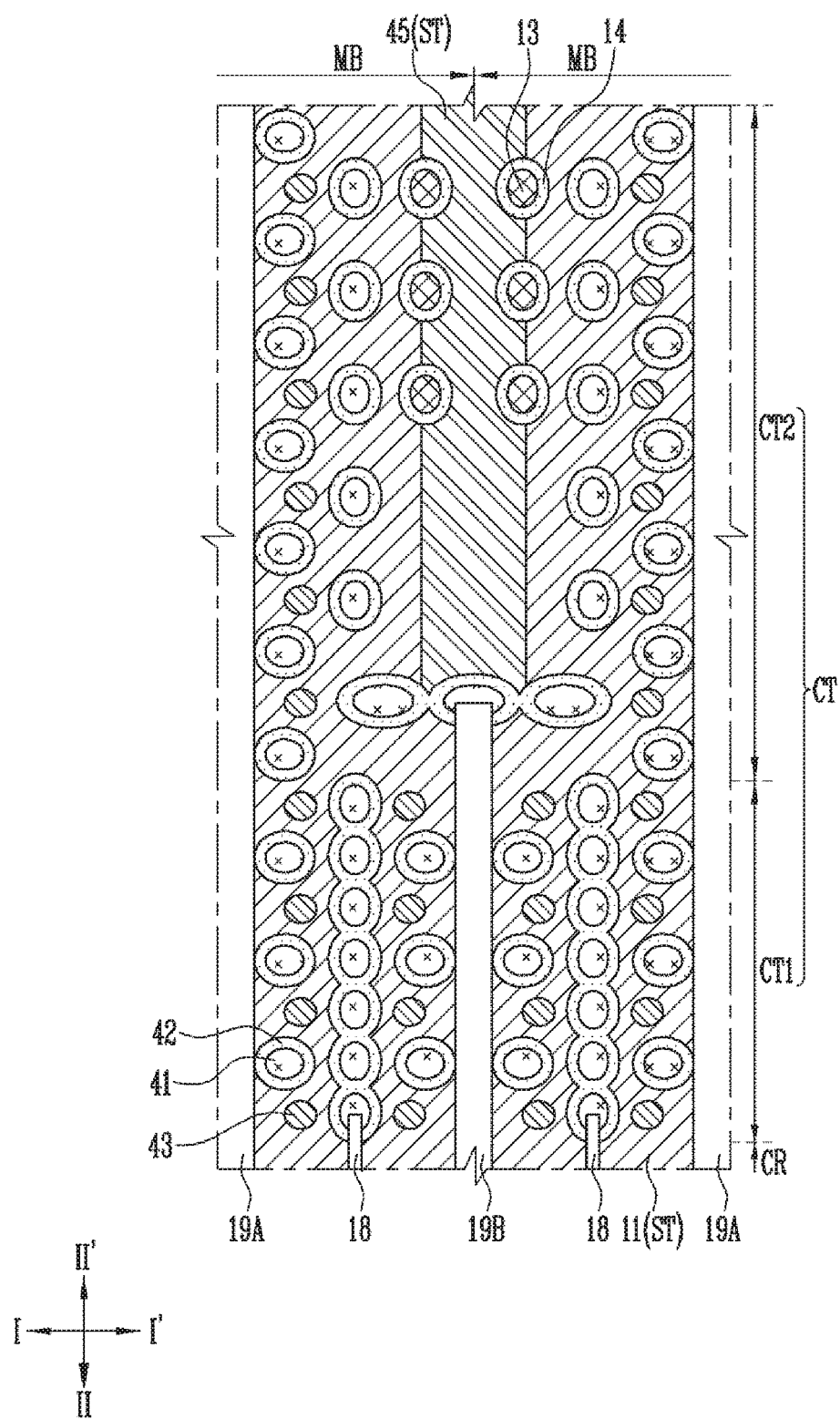

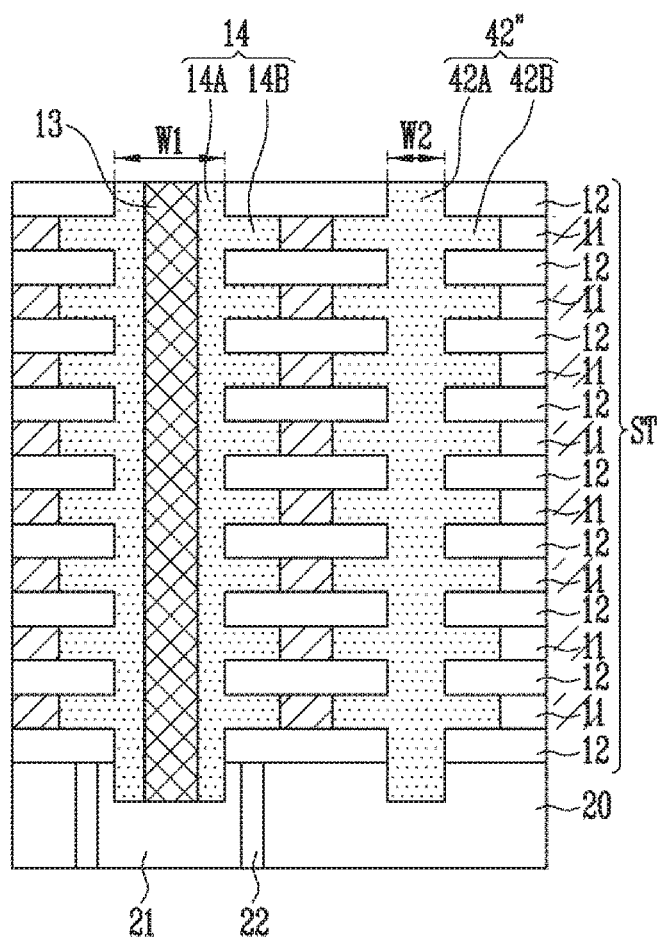

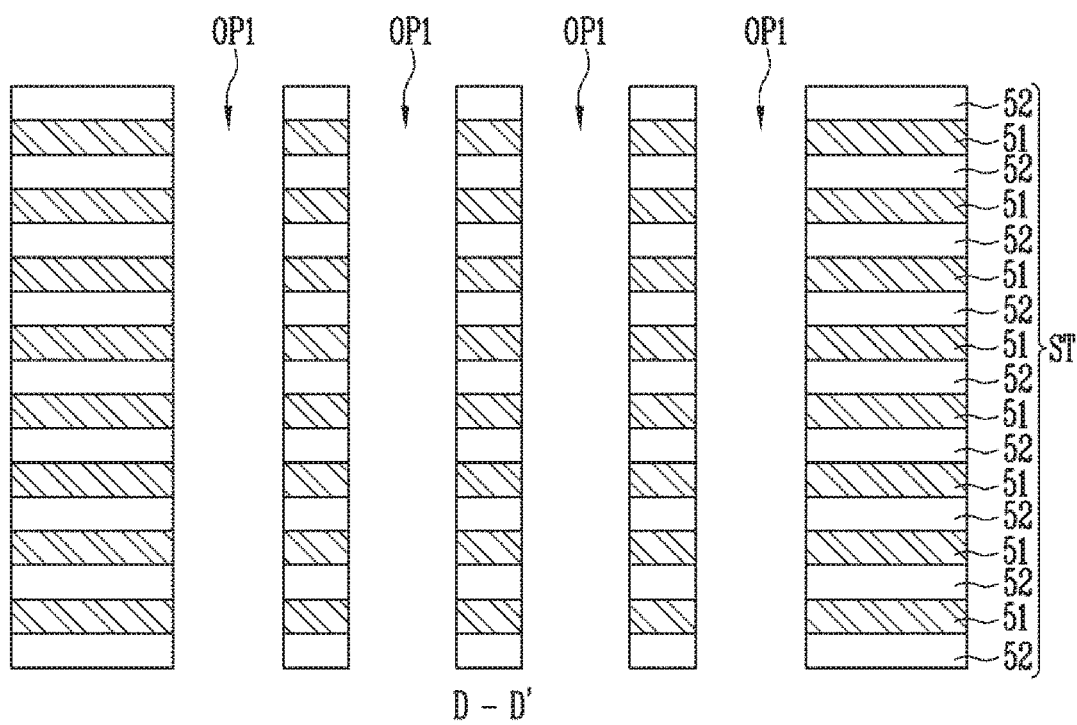

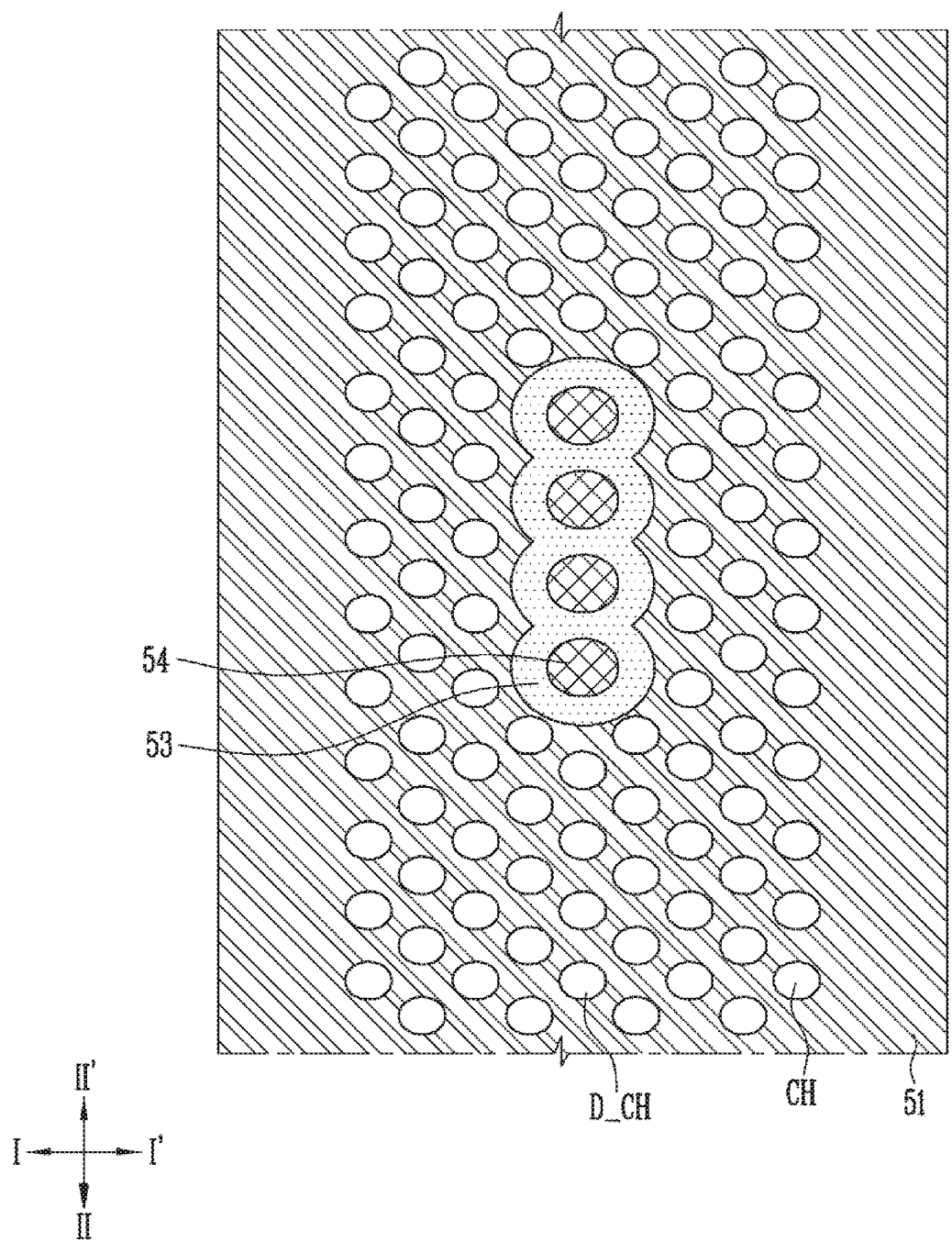

US 10,685,914 B2

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2017-0110971, filed on Aug. 31, 2017, and 10-2018-0023081, filed on Feb. 26, 2018, the entire disclosure of which is herein incorporated by reference in its entirety.

BACKGROUND

Field of Invention

Various embodiments of the invention relate to an electronic device, and more particularly, to a semiconductor device and a manufacturing method thereof.

Description of Related Art

Non-volatile memory devices are used to store data which need to be maintained even in the absence of power supply. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes stacked alternately with each other, and channel layers passing therethrough, and memory cells may be stacked along the channel layers. Various structures and manufacturing methods have been developed to improve the operational reliability of three-dimensional non-volatile memory devices.

SUMMARY

Various embodiments are directed to a semiconductor device that can be produced with easy manufacturing processes, having a stabilized structure and improved characteristics, and a manufacturing method thereof.

In accordance with an embodiment, a semiconductor device may include a wiring structure, a stacked structure formed over the wiring structure, channel structures passing through the stacked structure, contact plugs passing through the stacked structure, the contact plug being electrically connected to the wiring structure, and insulating spacers each including loop patterns surrounding a sidewall of a respective contact plug and stacked along the sidewall of the respective contact plug.

In accordance with an embodiment, a semiconductor device may include a stacked structure, plugs passing through the stacked structure in a stacking direction, and spacers each including loop patterns surrounding each of the plugs and stacked along a sidewall each of the plugs, wherein loop patterns of neighboring spacers are coupled to each other.

In accordance with an embodiment, a method of manufacturing a semiconductor device may include forming a wiring structure, forming a stacked structure including first material layers and second material layers stacked alternately with each other on the wiring structure, forming first openings passing through the stacked structure, forming second openings by partially etching the first material layers exposed through the first openings, forming insulating spacers each including loop patterns located in the second openings; and forming contact plugs electrically coupled to the wiring structure in the first openings.

In accordance with an embodiment, a method of manufacturing a semiconductor device may include forming a stacked structure, forming first openings passing through the stacked structure, forming second openings protruding from sidewalls of the first openings, forming spacers each including loop patterns filling the second openings, and forming plugs in the first openings, wherein the second openings of neighboring first openings are coupled to each other.

BRIEF DESCRIPTION OF THE DRAWINGS

FIG. 2A is a layout view, and FIGS. 2B to 2D are cross-sectional views taken along line A-A' of FIG. 2A;

FIG. 3A is a layout view, and FIGS. 3B to 3D are cross-sectional views taken along line A-A' of FIG. 3A;

FIG. 4A is a layout view, and FIG. 4B is a cross-sectional view taken along line A-A' of FIG. 4A;

FIGS. 6A and 6B are diagrams illustrating the configuration of a semiconductor device in accordance with an embodiment;

FIGS. 7A to 7D are layout views illustrating the structure of a semiconductor device in accordance with an embodiment;

FIGS. 8A to 8C are diagrams illustrating the structure of a semiconductor device in accordance with an embodiment;

FIGS. 9A to 13A and FIGS. 9B to 13B are diagrams and cross-sectional views illustrating a method of manufacturing a semiconductor device in accordance with an embodiment;

DETAILED DESCRIPTION

Figure 1A:
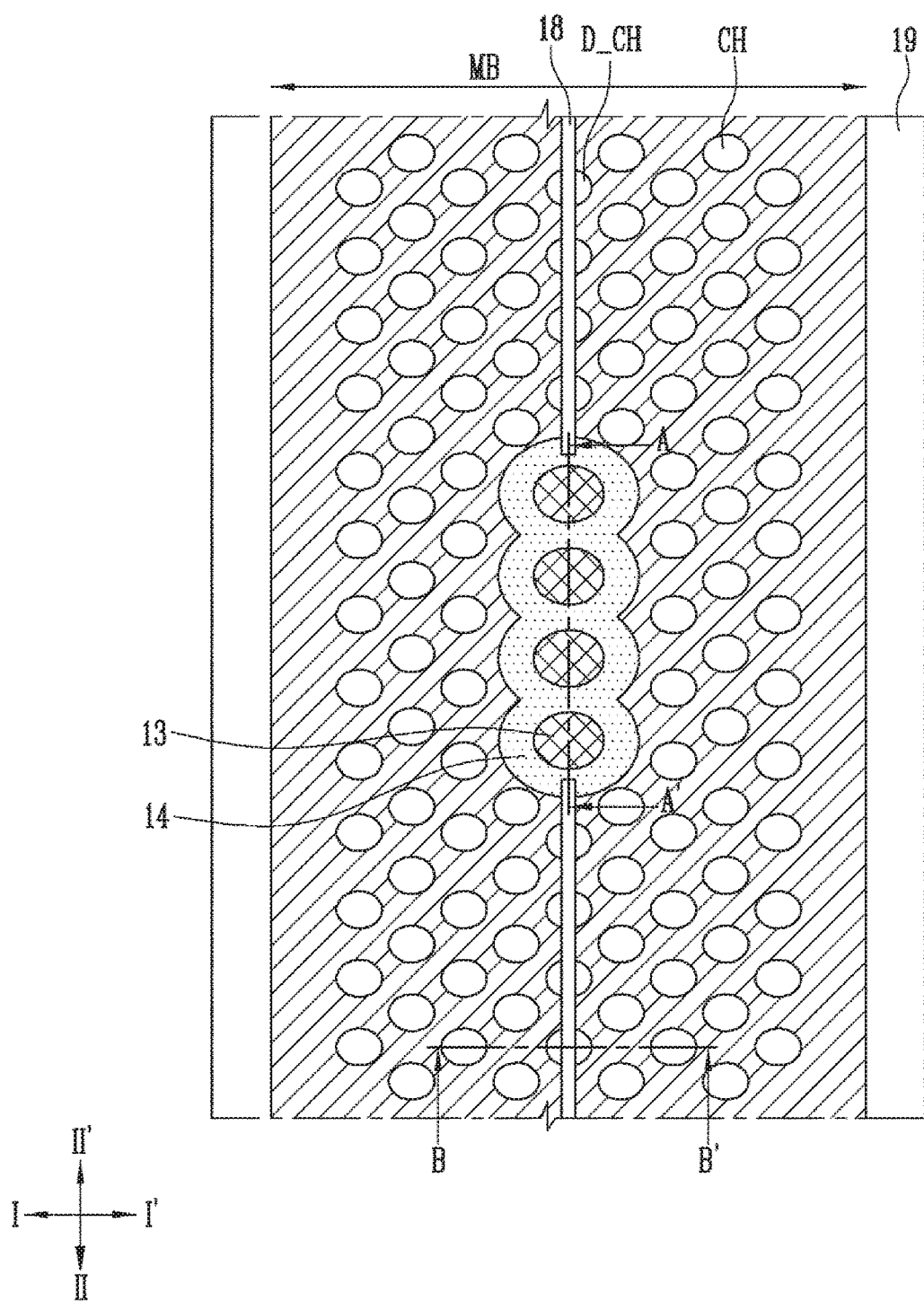
FIGS. 1A to 1C are diagrams illustrating the structure of a semiconductor device in accordance with an embodiment of the invention.

Hereinafter, various exemplary embodiments will be described in detail with reference to the accompanying drawings. In the drawings, thicknesses and lengths of components may be exaggerated for convenience of illustration. In the following description, a detailed description of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. In addition, throughout the specification, when it is said that a certain part "includes" a certain element, this does not exclude other elements from being included but the certain part may further include another element unless particularly described otherwise.

Figure 1B:
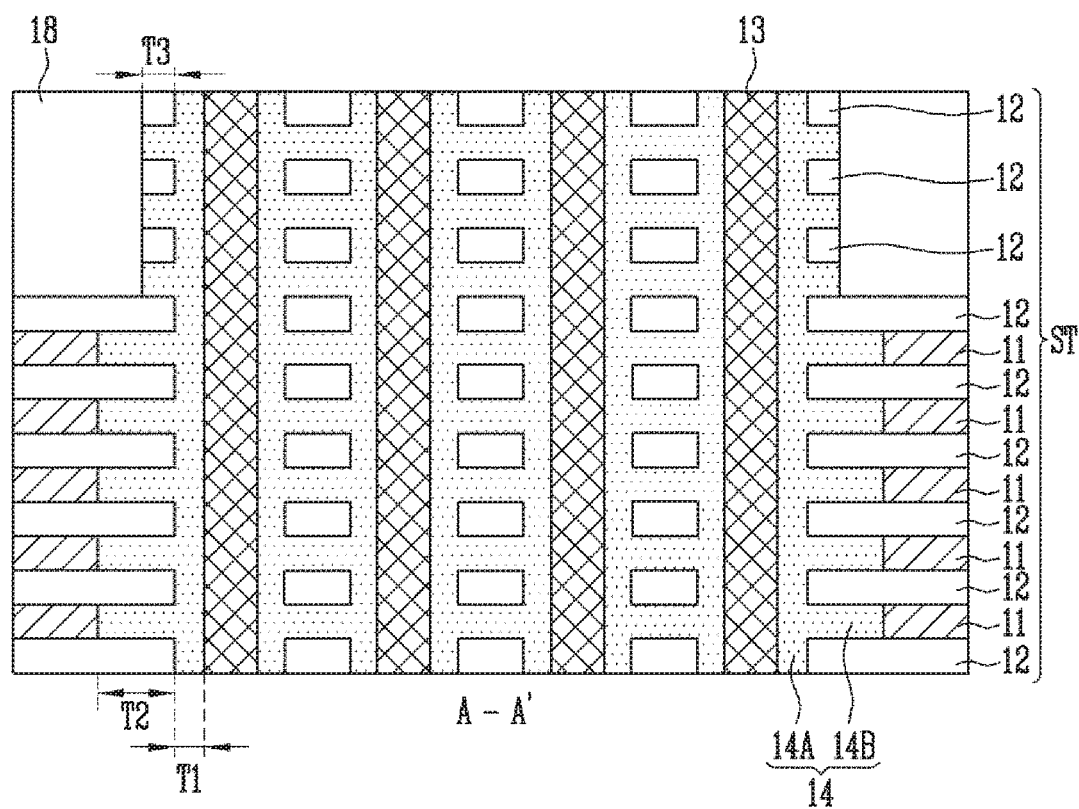
Figure 1C:
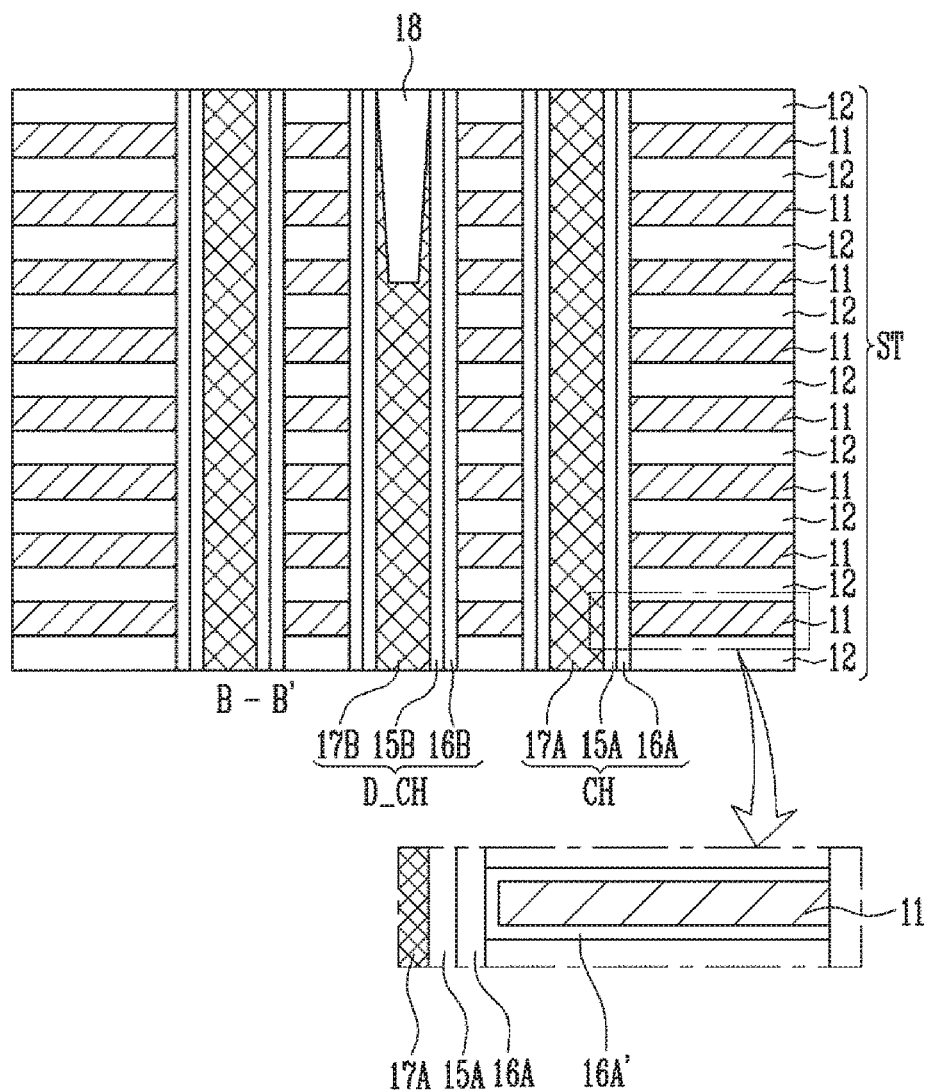

FIGS. 1A to 1C are diagram illustrating the structure of a semiconductor device in accordance with an embodiment of the invention. FIG. 1A is a diagram illustrating a semiconductor, FIG. 1B is a cross-sectional view taken along line A-A' of FIG. 1A, and FIG. 1C is a cross-sectional view taken along line B-B' of FIG. 1A.

Referring to FIGS. 1A to 1C, a semiconductor device in accordance with an embodiment may include a stacked structure ST, plugs passing through the stacked structure ST in a stacking direction, and spacers surrounding the plugs, respectively, and including loop patterns stacked along sidewalls of the plugs. In addition, each of the spacers may further include a coupling pattern surrounding the sidewall of each of the plugs and coupling the loop patterns to each other. The plugs may partially or completely pass through the stacked structure ST and may include a semiconductor material or a conductive material. For example, the plugs may be contact plugs 13, and the spacers may be insulating spacers 14. In addition, the semiconductor device may further include channel structures CH, dummy channel structures D_CH, isolation patterns 18, and slit insulating layers 19.

The structure ST may include conductive layers 11 and insulating layers 12 stacked alternately with each other. The conductive layers 11 may be gate electrodes such as for memory cells and for selection transistors, and may include tungsten. The insulating layers 12 may be provided to insulate the stacked conductive layers 11 from each other, and include an insulating material such as an oxide.

For example, at least one uppermost conductive layer 11 may be an upper selection line, at least one lowermost conductive layer 11 may be a lower selection line, and the remaining conductive layers 11 may be word lines. In this example, at least one lower selection transistor, a plurality of memory cells, and at least one upper selection transistor may be coupled in series to form a vertical memory string. The upper selection transistor may be a drain selection transistor and the lower selection transistor may be a source selection transistor. In addition, lower structures, such as a source line, a wiring structure, and a peripheral circuit, may be located under the stacked structure ST.

In another example, at least one uppermost conductive layer 11 may be a selection line, at least one lowermost conductive layer 11 may be a pipe gate, and the remaining conductive layers 11 may be word lines. In addition, lower structures, such as a wiring structure, and a peripheral circuit, may be located under the stacked structure ST. In this example, at least one first selection transistor, a plurality of memory cells MC, at least one pipe transistor, a plurality of memory cells, and at least one second selection transistor may be coupled in series to form a single memory string. The first selection transistor may be a drain selection transistor and the second selection transistor may be a source selection transistor.

The plurality of channel structures CH may be arranged in a first direction I-I' and a second direction II-II' crossing the first direction I-I'. In addition, the channel structures CH adjacent to each other in the first direction I-I' may be arranged in a staggered form so that centers thereof may be offset from each other.

The plurality of channel structures CH may be formed to provide a current path for the selection transistors and memory cells and include semiconductor patterns comprising silicon (Si) or germanium (Ge). Each of the channel structures CH may include a channel layer 15A and a memory layer 16A surrounding the channel layer 15A. A central portion of each of the channel layers 15A may be opened or filled. The opened central portion of the channel layer 15A may be filled with a gap-filling insulating layer 17A formed in the channel layer 15A.

The memory layer 16A may include at least one of a tunnel insulating layer, a data storing layer, and a charge blocking layer. The data storing layer may include a floating gate, a charge trapping material, nanodots, and a phase-change material. In addition, the semiconductor device may include a memory layer 16A' surrounding each of the conductive layers 11. The memory layer 16A' may include at least one of a tunnel insulating layer, a data storing layer, and a charge blocking layer. For example, the memory layer 16A' may be a charge blocking layer including a material with a high dielectric constant.

The dummy channel structures D_CH may be located between the channel structures CH and arranged in the second direction II-II'. Each of the dummy channel structures D_CH may have a similar structure to each of the channel structures CH. For example, the dummy channel structures D_CH may include a dummy channel layer 15B surrounding a dummy channel layer 15B and a dummy memory layer 16B surrounding the dummy channel layer 15B. The dummy channel layer 15B may include a dummy gap-filling insulating layer 17B.

The isolation pattern 18 may be formed to separate the conductive layers 11 at the same level. The isolation pattern 18 may have a linear shape extending in the second direction II-II'. The isolation pattern 18 may be an insulating material such as an oxide.

The isolation pattern 18 may have a depth so that the isolation pattern 18 may pass through a portion of the stacked structure ST. For example, the isolation pattern 18 may be deep enough to pass through at least one uppermost conductive layer 11 and not to pass through the remaining conductive layers 11. At least one uppermost conductive layer 11 may be a selection line. Therefore, the stacked structure ST may have a depth such that the isolation pattern 18 may pass an upper selection line, a first selection line, a second selection line, a source selection line or a drain selection line, and may not pass through a word line.

The isolation pattern 18 may overlap with the dummy channel structures D_CH. For example, the isolation pattern 18 may partially pass through the dummy channel structures D_CH.

The slit insulating layer 19 may partially or fully pass through the stacked structure ST. The slit insulating layer 19 may be located in the memory block MB, or at the boundary between neighboring memory blocks MB. The slit insulating layer 19 located at the boundary between the neighboring memory blocks MB may electrically isolate the neighboring memory blocks MB from each other. For example, the slit insulating layer 19 may have a linear shape extending in the second direction II-II'. In addition, the slit insulating layer 19 may include an insulating material such as an oxide.

The contact plugs 13 may pass through the stacked structure ST and be electrically connected to the lower structure under the stacked structure ST. For example, the contact plugs 13 may be electrically connected to the wiring structure located under the stacked structure ST. In addition, the contact plugs 13 may include a conductive material such as polysilicon or metal.

The contact plugs 13 may be arranged in the second direction II-II'. For example, the contact plugs 13 may be located between the channel structures CH and be aligned with the dummy channel structures D_CH so that centers of the contact plugs 13 may coincide with those of the dummy channel structures D_CH. The contact plugs 13 may be arranged at regular or irregular distances. As shown in FIGS. 1A to 1C, the contact plugs 13 may be arranged at regular distances.

In addition, the contact plugs 13 may have a similar or different cross section from the channel structures CH and the dummy channel structures D_CH. For example, the contact plugs 13 may have various cross sections, such as a circle, an oval, a rectangle, and a polygon. In addition, the contact plugs 13 may have a greater width than the channel structure CH or the dummy channel structure D_CH.

Each of the insulating spacers 14 may surround each of the contact plugs 13. Each of the insulating spacers 14 may include loop patterns 14B surrounding a sidewall of each of the contact plugs 13 and stacked on the sidewall of each contact plug 13. The loop patterns 14B may be located at levels corresponding to the conductive layers 11. In addition, each of the insulating spacers 14 may include a coupling pattern 14A surrounding the sidewall of each contact plug 13 and coupling the loop patterns 14B to each other. The coupling pattern 14A may extend in a longitudinal direction of the contact plug 13 or in a stacking direction of the stacked structure ST. One insulating spacer 14 may include a plurality of loop patterns 14B, and the loop patterns 14B may be coupled to each other by the coupling pattern 14A. Therefore, the loop patterns 14B of each insulating spacer 14 may protrude from the coupling pattern 14A. In addition, the insulating layers 12 may be interposed between the stacked loop patterns 14B.

The insulating spacers 14 may be provided to insulate the contact plugs 13 and the conductive layers 11 from each other, and may include an insulating material such as an oxide. In addition, an insulation function of the insulating spacers 14 may be controlled by a thickness T2 of the loop patterns 14B.

Each of the insulating spacers 14 may include a first region corresponding to the conductive layers 11 and a second region corresponding to the insulating layers 12. Since the first region directly contacts the conductive layers 11, the thickness of the first region may be increased to improve the insulation function thereof. Therefore, each of the insulating spacers 14 may include the loop patterns 14B in the first region directly contacting the conductive layers 11. A distance T1 may be defined between the insulating layers 12 and the contact plug 13 in the second region. Hence, the distance between the conductive layers 11 and the contact plug 13 may be increased to T1+T2 in the first region. In other words, the distance may be increased by the thickness T2 of the loop patterns 14B. Therefore, the function of the insulating spacers 14 may be improved without causing an increase in area. For example, a thickness (T1) of the coupling pattern 14A may be ½ or more than ½ of the thickness of each of the conductive layers 11.

The loop patterns 14B of neighboring insulating spacers 14 may be coupled to each other. For example, the loop patterns 14B located at the same level may be coupled to each other. The conductive layers 11 may not be located between neighboring contact plugs 13 while the insulating layers 12 and the insulating spacers 14 may be located therebetween. Therefore, the loop patterns 14B and the insulating layers 12 may be alternately stacked in the regions defined between the neighboring contact plugs 13.

In addition, the insulating spacers 14 may partially overlap with adjacent layers. For example, the isolation pattern 18 may overlap with the dummy channel structures D_CH. The insulating spacers 14 may contact the dummy memory layer 16B, the dummy channel layer 15B, or the dummy gap-filling insulating layer 17B. In another example, the insulating spacers 14 may be coupled to the isolation pattern 18. The insulating spacers 14 and the isolation pattern 18 may insulate the conductive layers 11 at the same levels from each other. In other words, the conductive layers 11 at both sides on the basis of the insulating spacers 14 and the isolation pattern 18 may be insulated from each other. Therefore, the insulating spacers 14 may be provided to insulate the contact plugs 13 and the conductive layers 11 from each other and may function as slit insulating layer with the isolation pattern 18.

In addition, the loop patterns 14B contacting the isolation pattern 18 may have a different thickness from the remaining loop patterns 14B. For example, first loop patterns 14B corresponding to the isolation patterns 18 may have a smaller thickness T3, and second loop patterns 14B corresponding to the conductive layers 11 may have a greater thickness T2. In other words, in the embodiment of FIG. 1B, the second loop patterns 14B protrude more than the first loop patterns 14B.

Figure 2A:
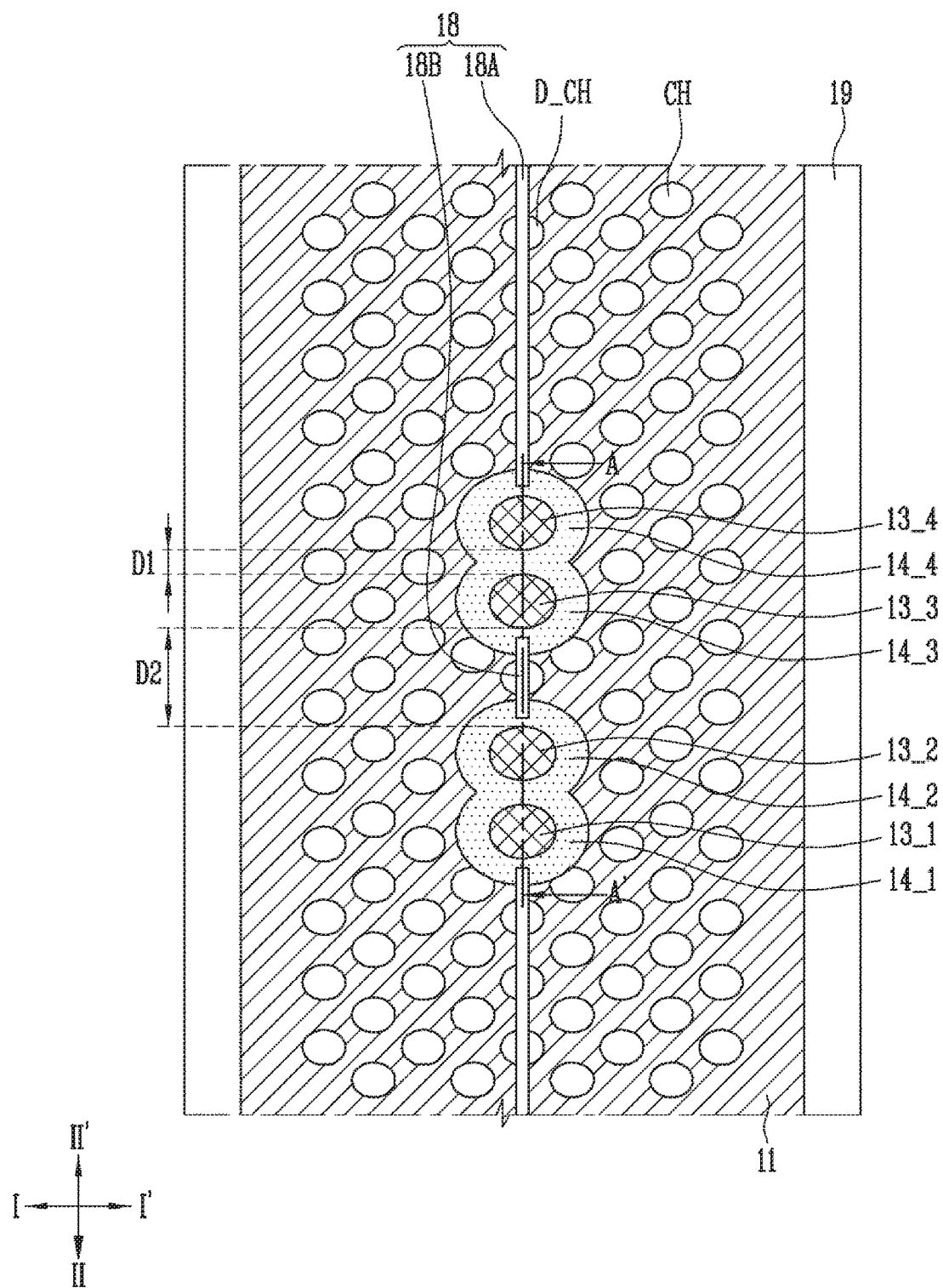
FIGS. 2A to 2D are diagrams illustrating the structure of a semiconductor device in accordance with an embodiment.
Figure 2B:
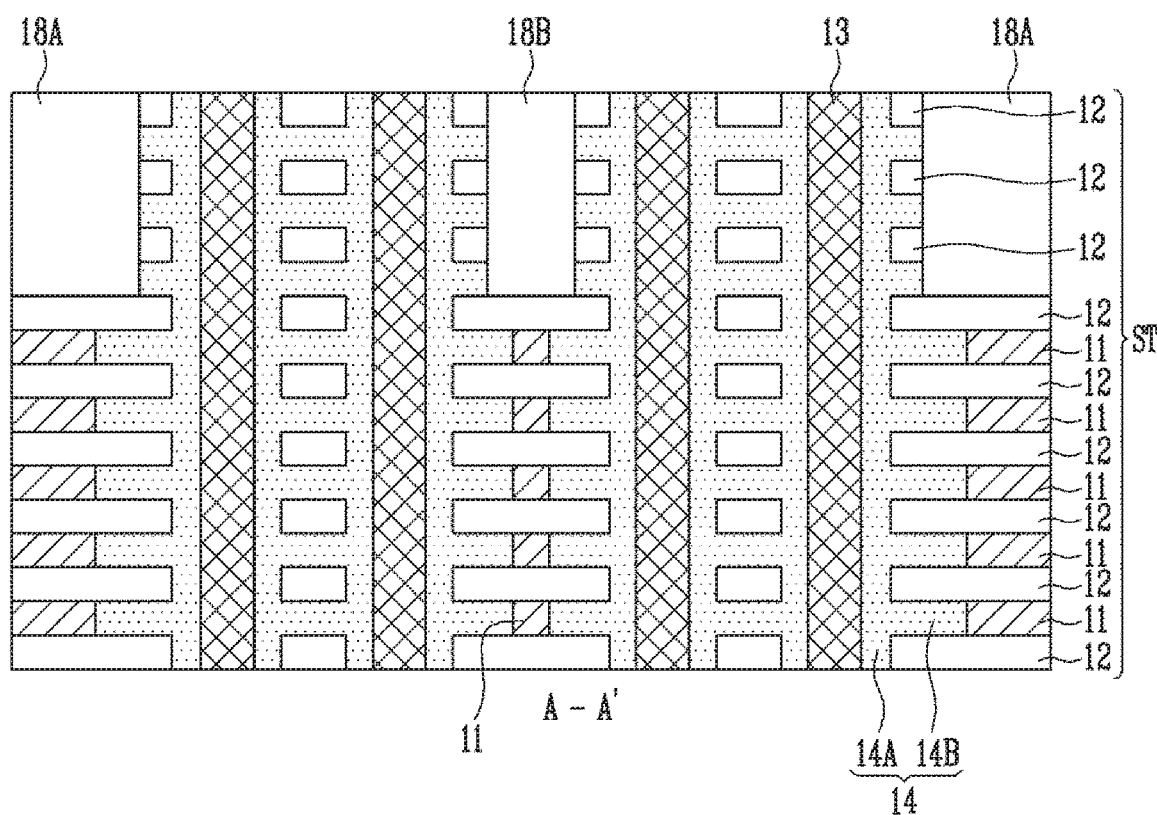
Figure 2C:
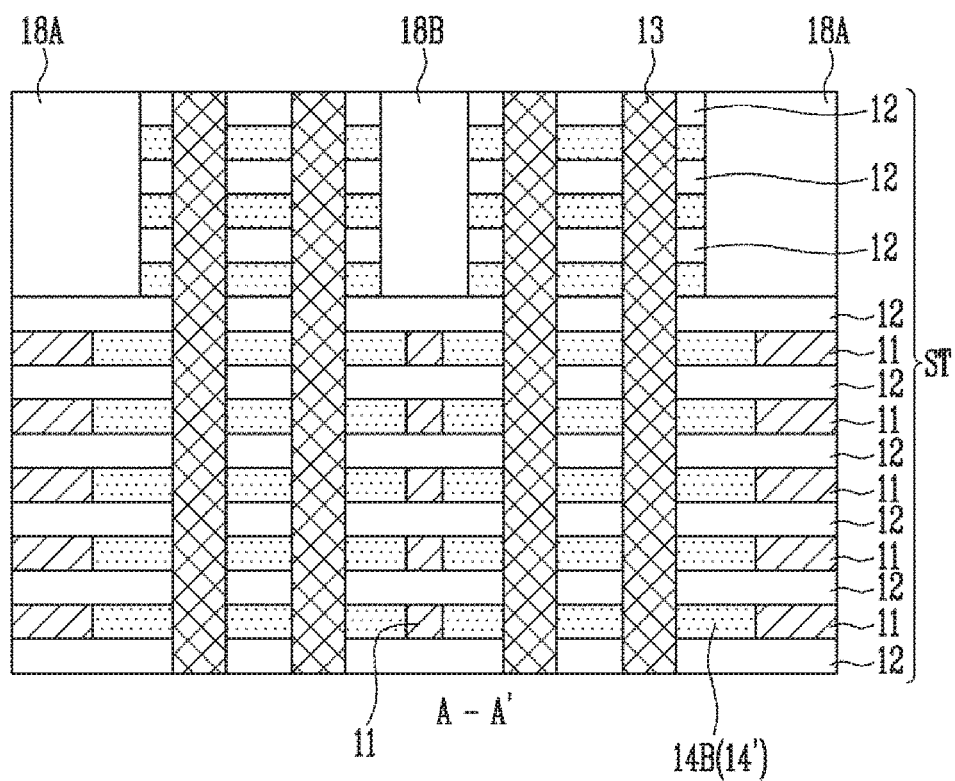
Figure 2D:
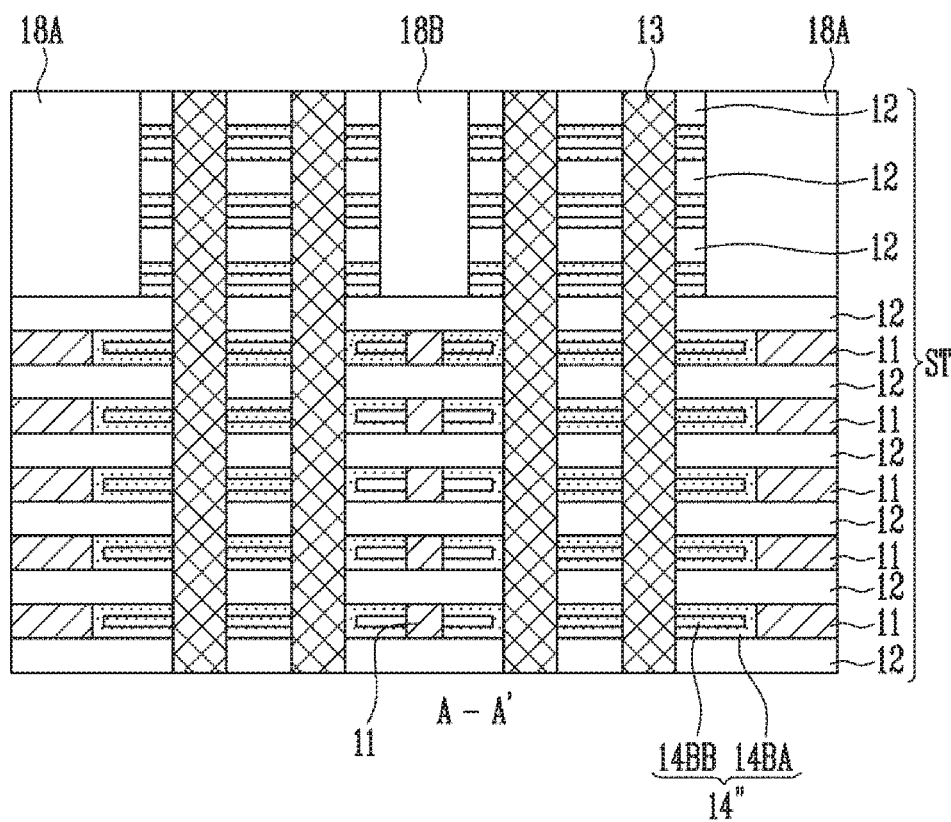

FIGS. 2A to 2D are diagrams illustrating the structure of a semiconductor device in accordance with an embodiment. FIG. 2A is a layout view, and FIGS. 2B to 2D are cross-sectional views taken along line A-A' of FIG. 2A. Hereinafter, any repetitive detailed description of components already mentioned above will be omitted.

Referring to FIGS. 2A and 2B, contact plugs 13_1 to 13_4 may be arranged at different distances. In addition, insulating spacers 14_1 to 14_4 may be coupled to or decoupled from each other according to the distances between the contact plugs 13_1 to 13_4.

For example, the insulating spacers 14_1/14_2 and 14_3/14_4 of the contact plugs 13_1/13_2 and 13_3/13_4 arranged at a smaller distance D1 may be coupled to each other, and the insulating spacers 14_2/14_3 of the contact plugs 13_2/13_3 arranged at a larger distance D2 may be separated from each other.

In another example, the contact plugs may include first to 2nth contact plugs (13_1 to 13_4), the first to nth contact plugs may be coupled to first to nth insulating spacers (14_1/14_2), the nth insulating spacer (14_2) of the nth contact plug 13_2 and an (n+1)th insulating spacer (14_3) of an (n+1)th contact plug (13_3) may be separated from each other, and the (n+1)th to 2n insulating spacers (14_3/14_4) of the (n+1)th to 2nth contact plugs (13_3/13_4) may be coupled to each other. In this example, n may be an integer of 2 or more.

A second isolation pattern 18B may be further located between the separated insulating spacers 14_2/14_3. For example, the second isolation pattern 18B may be located between the contact plugs 13_2/13_3 arranged at the larger distance D2. In another example, the second isolation pattern 18B may be located between the nth insulating spacer 14_2 and the (n+1)th insulating spacer 14_3. In this example, a first isolation pattern 18A, the insulating spacers 14_1 and 14_2, the second isolation pattern 18B, and the insulating spacers 14_3 and 14_4 may be coupled to each other to insulate the conductive layers 11 at both sides from each other.

In addition, at least one dummy channel structure D_CH may be further located between the insulating spacers 14_2/14_3 separated from each other. The dummy channel structure D_CH may overlap the second isolation pattern 18B.

FIGS. 2C and 2D show modified examples of FIG. 2B. Referring to FIG. 2C, an insulating spacer 14' may include the loop patterns 14B surrounding a sidewall of the contact plug 13 and may not include a coupling pattern. The loop patterns 14B may be located at the same levels as the conductive layers 11 and may be made of or include an insulating material. Therefore, the conductive layers 11 and the contact plugs 13 may be insulated from each other by the loop patterns 14B.

Referring to FIG. 2D, the loop patterns 14" may have a multilayer structure. The loop patterns 14" may have a stacked structure of layers including materials with high etch selectivity to each other. At least one of the stacked layers may be an insulating layer. For example, each of the loop patterns 14" may include a first insulating pattern 14BA and a second insulating pattern 14BB formed in the first insulating pattern 14BA. The second insulating pattern 14BB may be made of or include a material having a high etch selectivity to the first insulating pattern 14BA. For example, the first insulating pattern 14BA may be an oxide layer and the second insulating pattern 14BB may be a nitride layer.

Figure 3A:
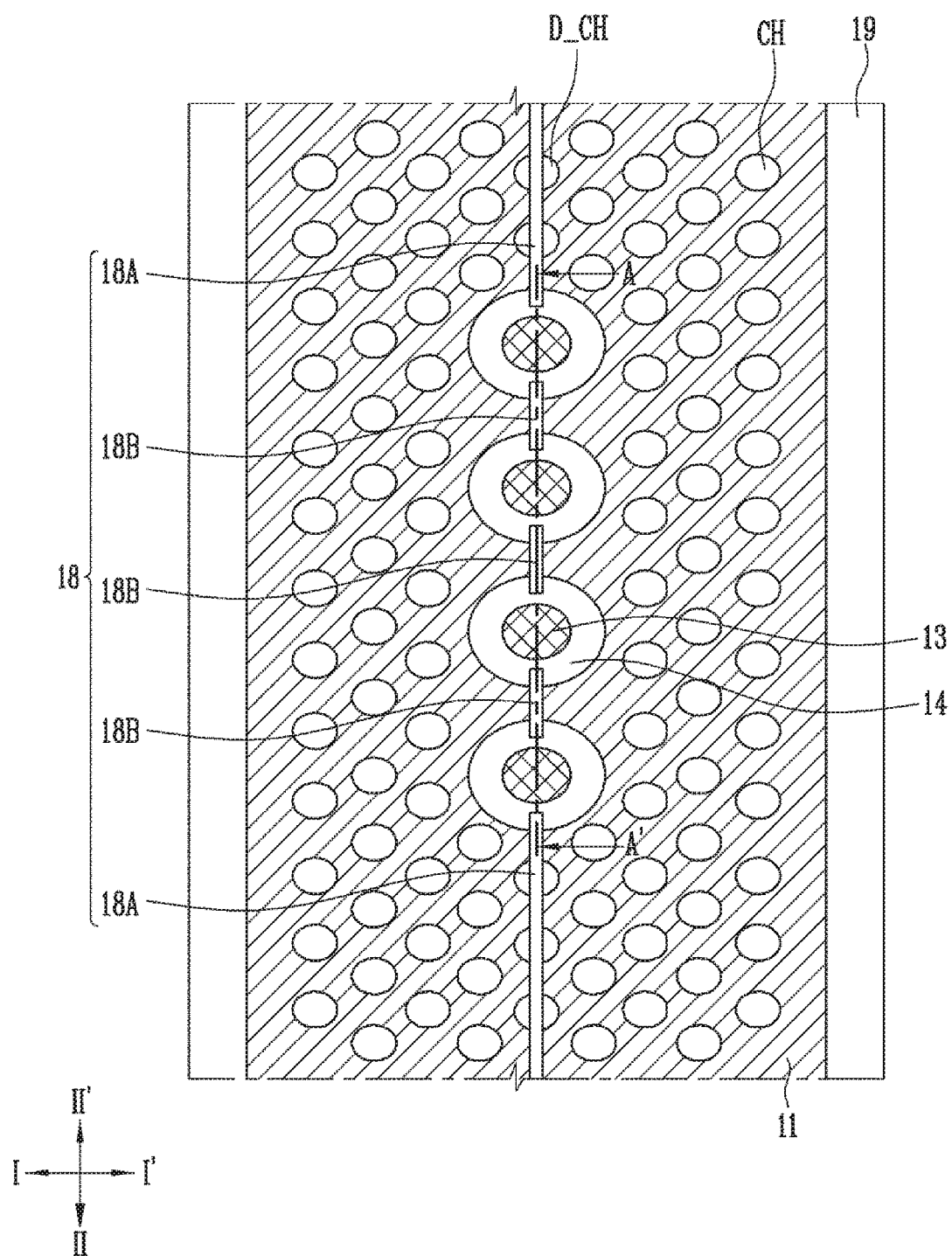
FIGS. 3A to 3D are diagrams illustrating the structure of a semiconductor device in accordance with an embodiment.
Figure 3B:
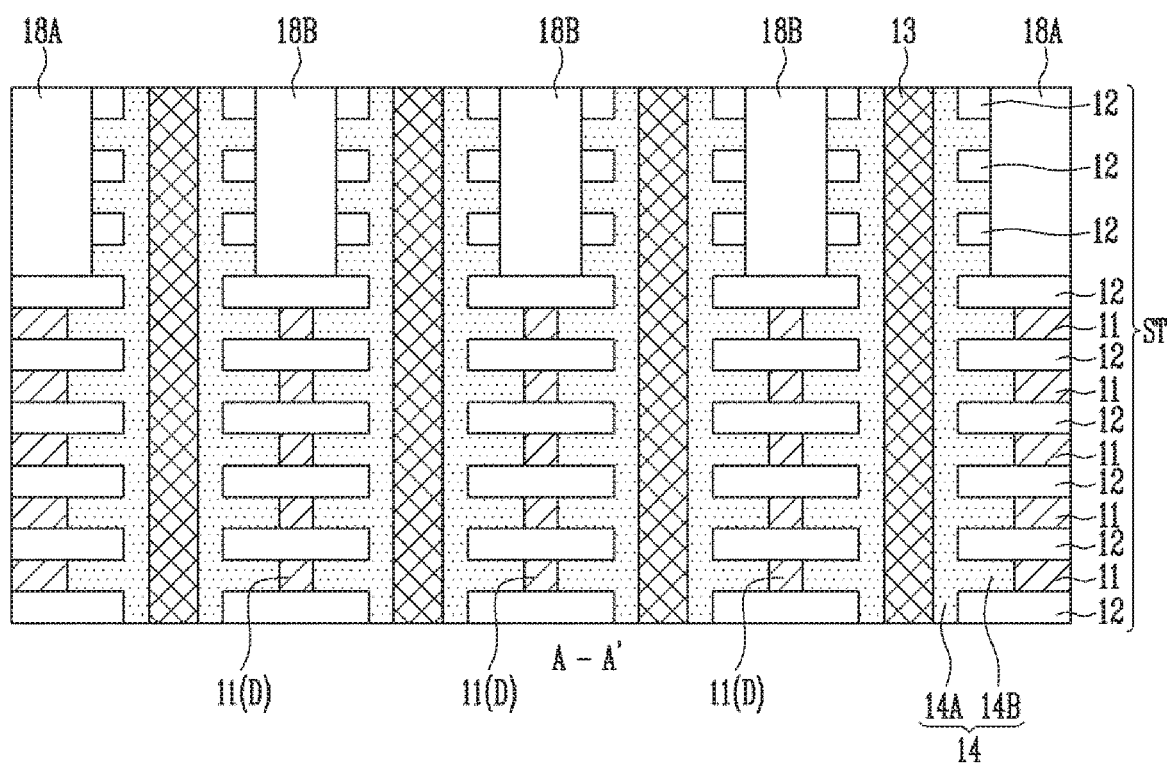
Figure 3C:
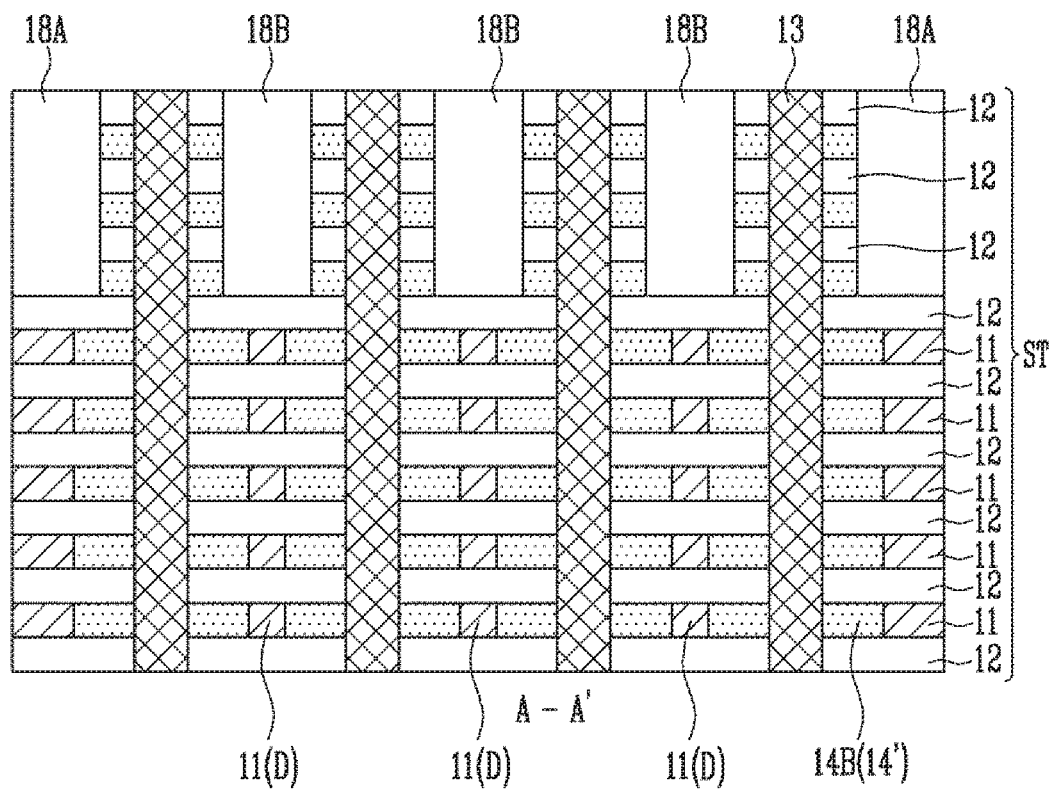
Figure 3D:
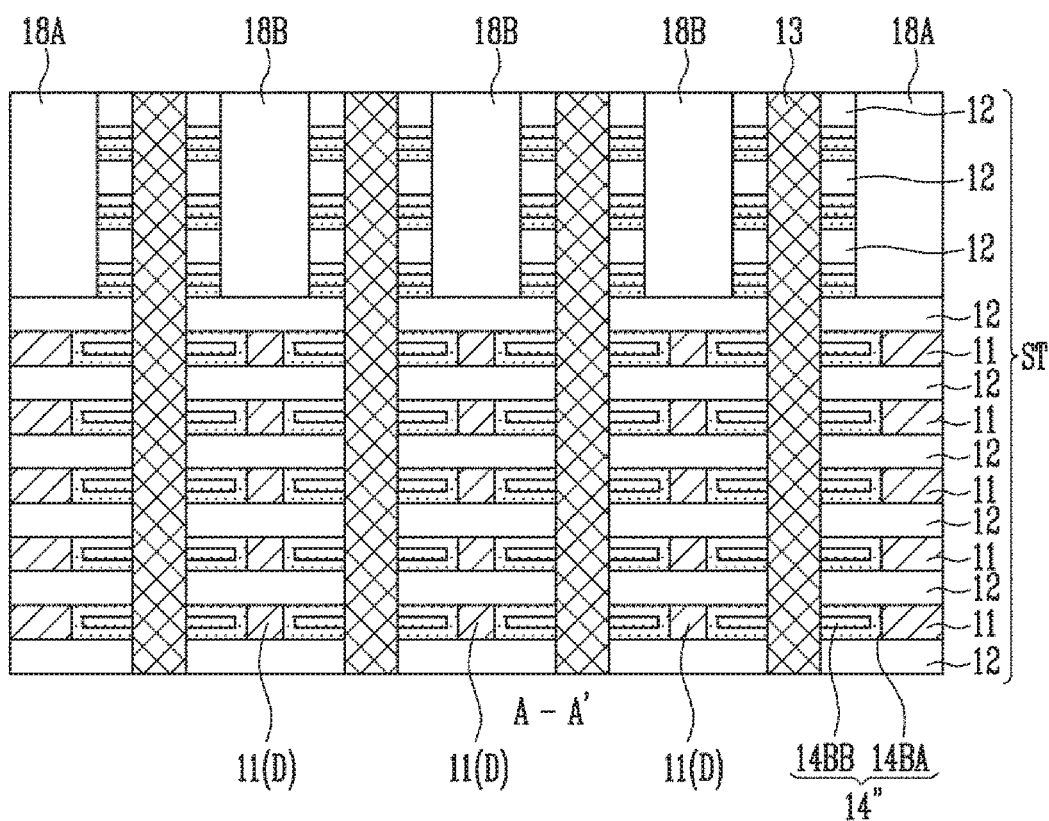

FIGS. 3A to 3D are diagrams illustrating the structure of a semiconductor device in accordance with an embodiment. FIG. 3A is a layout view, and FIGS. 3B to 3D are cross-sectional views taken along line A-A' of FIG. 3A. Hereinafter, any repetitive detailed description of components already mentioned above will be omitted.

Referring to FIGS. 3A and 3B, the contact plugs 13 may be arranged at a larger distance, and the insulating spacers 14 of neighboring contact plugs 13 may be separated from each other. The conductive layers 11 may be interposed between the loop patterns 14B of the separated insulating spacers 14.

Alternatively, dielectric layers D may replace the conductive layer 11 between the loop patterns 14B of the separated insulating spacers 14. The dielectric layers D may include material having high etch selectivity to the insulating layers 12. For example, the dielectric layers D may include a nitride, and the insulating layers 12 may include an oxide. The dielectric layers D may be residual layers of sacrificial layers used during manufacturing processes.

FIGS. 3C and 3D show modified examples of FIG. 3B. Referring to FIG. 3C, the insulating spacer 14' may include the loop patterns 14B surrounding a sidewall of the contact plug 13 and may not include a coupling pattern. Referring to FIG. 3D, the loop patterns 14B may have a multilayer structure. Each of the loop patterns 14B may include the first insulating pattern 14BA and the second insulating pattern 14BB formed in the first insulating pattern 14BB.

Figure 4A:
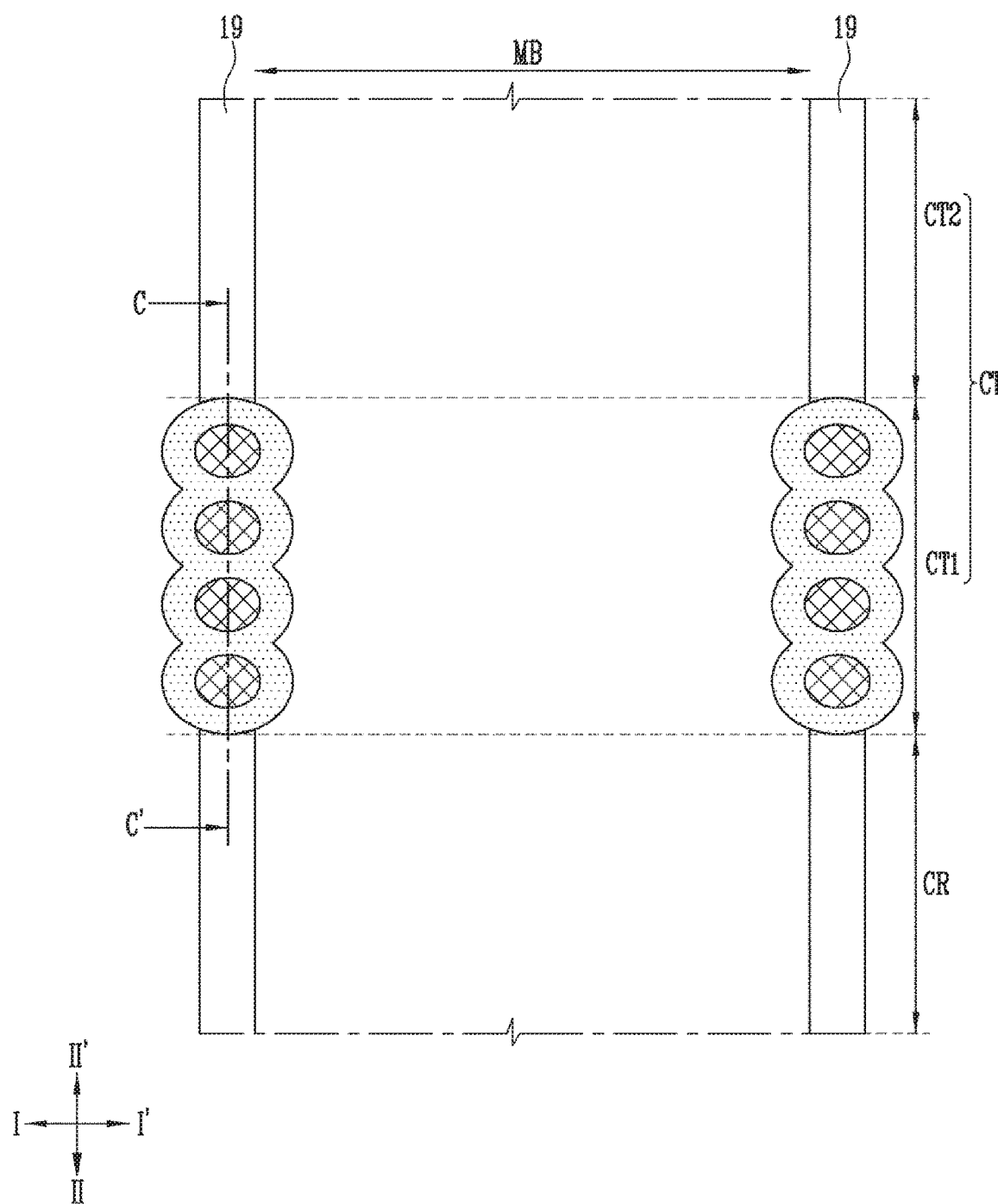
FIGS. 4A and 4B are diagrams illustrating the structure of a semiconductor device in accordance with an embodiment.
Figure 4B:
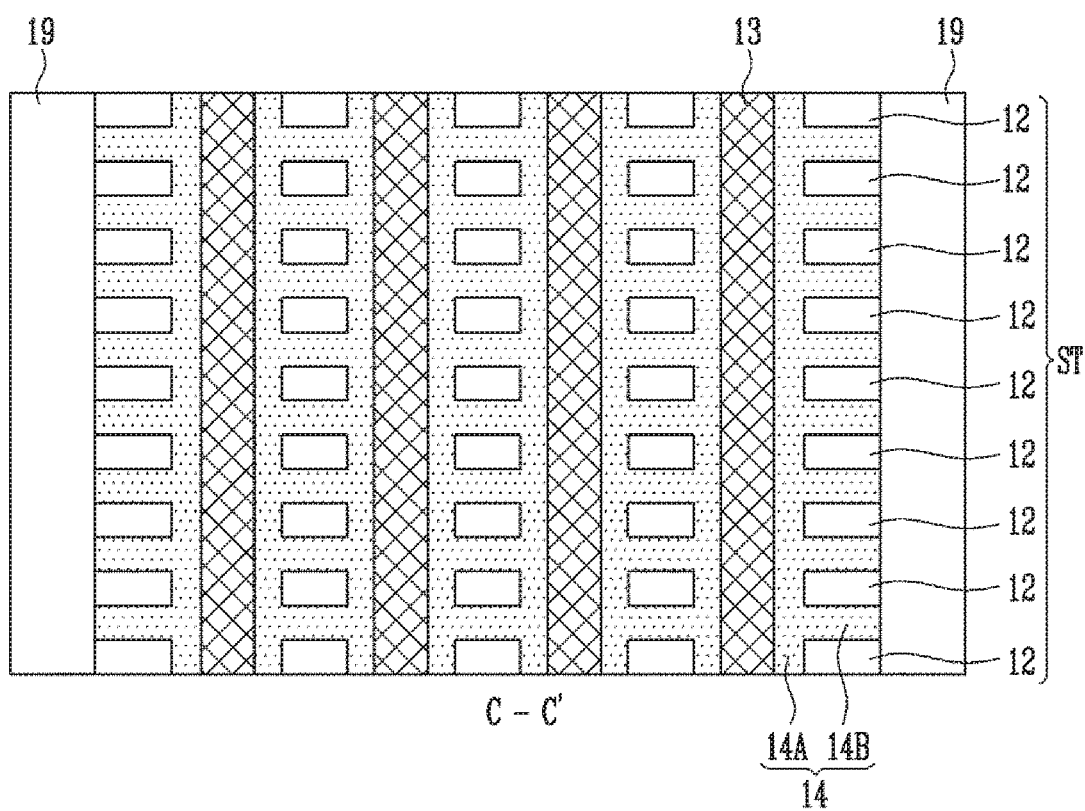

FIGS. 4A and 4B are diagrams illustrating the structure of a semiconductor device in accordance with an embodiment. FIG. 4A is a layout view, and FIG. 4B is a cross-sectional view taken along line C-C' of FIG. 4A. Hereinafter, any repetitive detailed description of components already mentioned above will be omitted.

Referring to FIGS. 4A and 4B, the contact plugs 13 and the insulating spacers 14 may overlap the slit insulating layer 19. For example, the contact plugs 13 and the insulating spacers 14 may be located at the boundary between neighboring memory blocks MB and overlap the slit insulating layer 19 located at the boundary between the neighboring memory blocks MB. The insulating spacers 14 and the slit insulating layer 19 that are coupled to each other may separate the neighboring memory blocks MB from each other.

The stacked structure ST may include a cell region CR and a contact region CT. Memory strings may be located in the cell region CR, and interconnections for driving each of selection transistors, memory cells, and pipe transistors included in the memory strings may be located in the contact region CT. Thus, the channel structures CH and the dummy channel structures D_CH as described above may be located in the cell region CR. Contact plugs and wires may be located in the contact region CT of the stacked structure ST. In addition, each of the conductive layers 11 may be exposed through the contact region CT of the stacked structure ST and have a stepped configuration.

In addition, the contact region CT may include a first contact region CT1 where an interconnection of at least one uppermost conductive layer 11 is located and a second contact region CT2 where interconnections of the remaining conductive layers 11 are located. For example, pads of upper selection lines may be located in the first contact region CT1, and pads of word lines may be located in the second contact region CT2.

As described above, the contact plugs 13 and the insulating spacers 14 may be located at the boundary between neighboring memory blocks MB so as to correspond to the cell region CR or the contact region CT of the stacked structure ST. For example, the contact plugs 13 and the insulating spacers 14 may be located to correspond to the first contact region CT1 of the stacked structure ST.

As described above with reference to FIGS. 1A to 3D, the contact plugs 13 and the insulating spacers 14 may be located in the memory block MB. Thus, the contact plugs 13 and the insulating spacers 14 may be located in the cell region CR or the contact region CT of the stacked structure ST.

In this embodiment, the contact plugs 13 and the insulating spacers 14 may be arranged as in the embodiment described with reference to FIGS. 1A and 1B. However, the arrangements and the configurations of the contact plugs 13 and the insulating spacers 14 may be changed with reference to the embodiment described with reference to FIGS. 2A to 3D.

Figure 5:
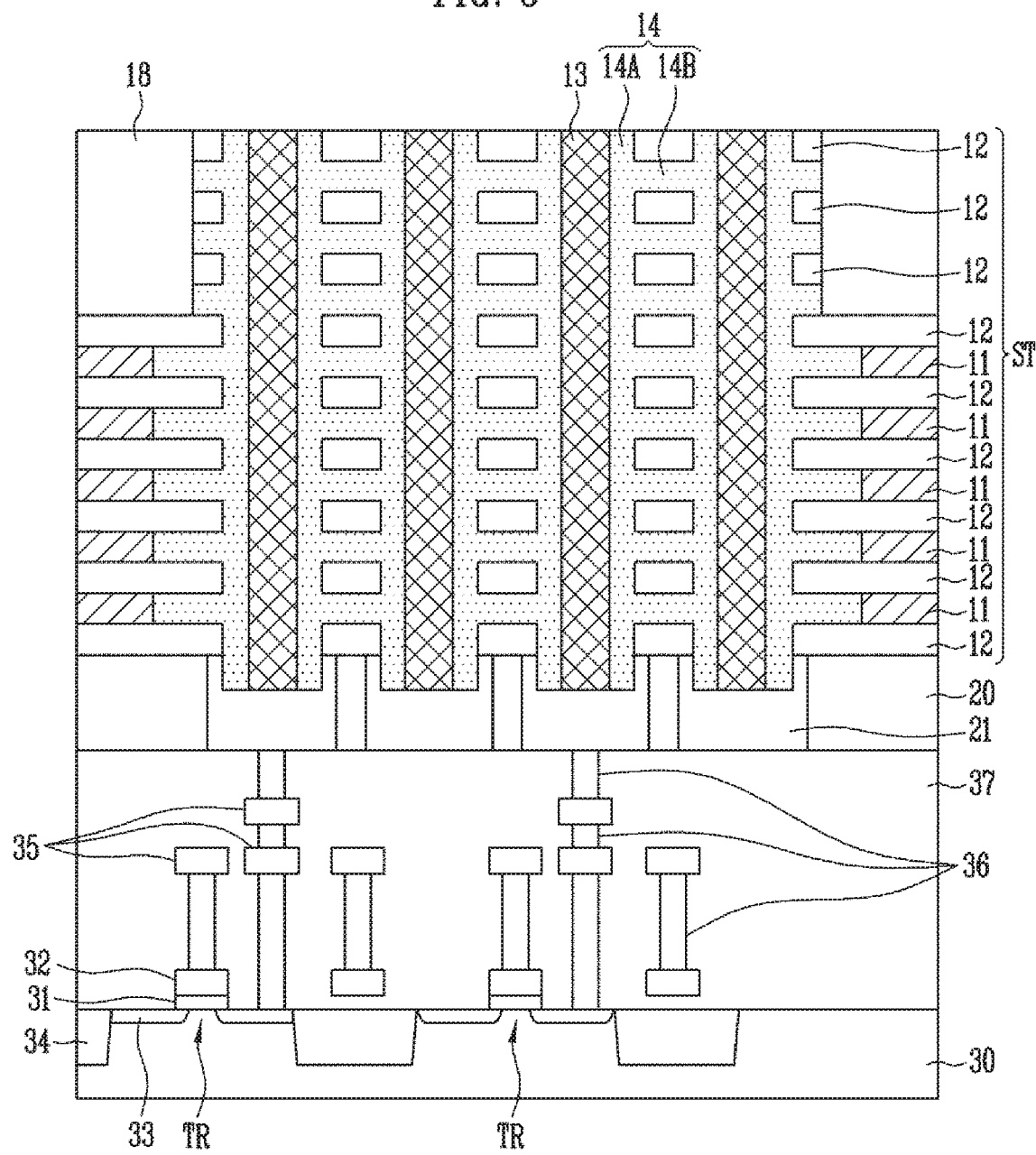
FIG. 5 is a cross-sectional diagram illustrating the structure of a semiconductor device in accordance with an embodiment.

FIG. 5 is a cross-sectional diagram illustrating the structure of a semiconductor device in accordance with an embodiment. Hereinafter, any repetitive detailed description of components already mentioned above will be omitted.

Referring to FIG. 5, the contact plugs 13 may be electrically connected to a wiring structure (35 and 36) located under the stacked structure ST. In addition, a peripheral circuit may be located under the stacked structure ST, and the contact plugs 13 may pass through the stacked structure ST and be coupled to the peripheral circuit through the wiring structure (35 and 36).

The semiconductor device may include a first substrate 20 located under the stacked structure ST. The first substrate 20 may be a semiconductor substrate and include pads 21 electrically connecting the contact plugs 13 to the wiring structure (35 and 36). In addition, the insulating layers may be interposed between the pads 21 and the first substrate 20, and the pads 21 and the first substrate 20 may be electrically isolated from each other by the insulating layers 22. However, the first substrate 20 may not include the pads 21, and the contact plugs 13 may pass through the insulating layers 22 and be directly coupled to the wiring structure (35 and 36).

A second substrate 30 may be located under the first substrate 20. The second substrate 30 may be a semiconductor substrate, and a peripheral circuit may be located in the second substrate 30. The peripheral circuit may be provided to drive a cell array and include a transistor, a switch, a register, an amplifier, and the like. For example, a transistor TR may include a gate electrode 32, a gate insulating layer 31, and a junction 33. In addition, an isolation layer 34 may be located in the second substrate 30.

An interlayer insulating layer 37 may be located between the first substrate 20 and the second substrate 30, and the wiring structure (35 and 36) may be located in the interlayer insulating layer 37. The wiring structure (35 and 36) may include wires 35 and contact plugs 36 coupled to the wires 35. The wires 35 may be arranged in a plurality of layers and coupled to the gate electrode 32 or the junction 33 of the transistor TR. In addition, the contact plugs 36 may couple the wires 35 to each other, or may electrically connect the wires 35 to the junction 33, the gate electrode 23, and the pad 21.

In this embodiment, the contact plugs 13 and the insulating spacers 14 may be arranged as in the embodiment described with reference to FIGS. 1A and 1B. However, the arrangements and the structures of the contact plugs 13 and the insulating spacers 14 may be changed with reference to the embodiment described with reference to FIGS. 2A to 3D.

In addition, the layout of the contact plugs 13 may be changed according to the layout of the peripheral circuit. For example, the position and spacing of the contact plugs 13 may be changed according to the layout of the peripheral circuit.

Figure 6B:
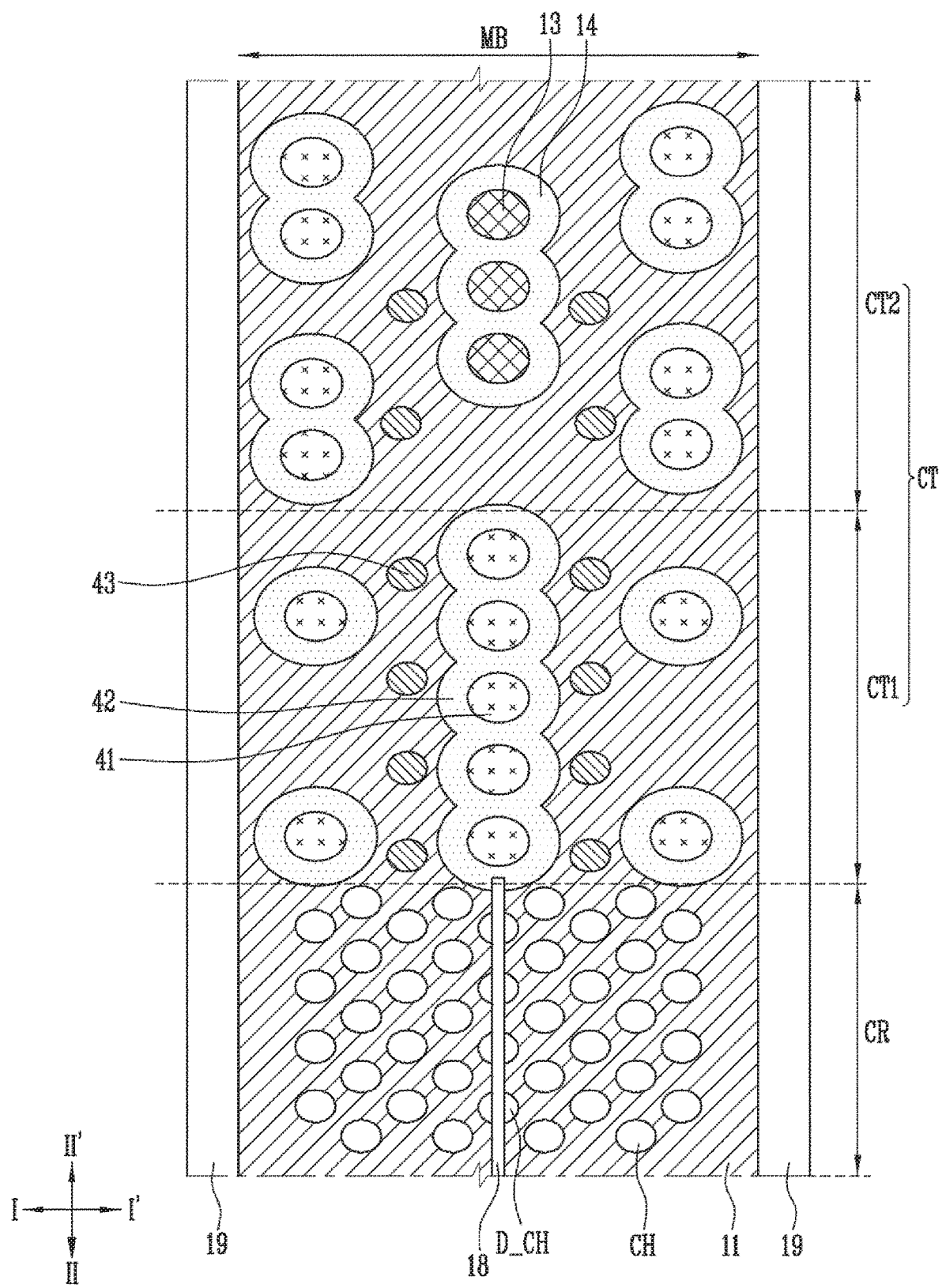

FIGS. 6A and 6B are layout views illustrating the configuration of a semiconductor device in accordance with an embodiment.

Referring to FIGS. 6A and 6B, a semiconductor device in accordance with an embodiment may include the channel structures CH, the dummy channel structure D_CH, first contact plugs 13, the insulating spacers 14, supporting plugs 41, supporting spacers 42, second contact plugs 43, isolation patterns 18, and the slit insulating layer 19.

The channel structures CH, the dummy channel structures D_CH, and the isolation patterns 18 may be located in the cell region CR. The dummy channel structures D_CH may overlap with the isolation patterns 18, and the isolation patterns 18 may be extended to the contact region CT. For example, the isolation patterns 18 may overlap the supporting spacers 42, or both the supporting plugs 41 and the supporting spacers 42.

The first contact plugs 13, the insulating spacers 14, the supporting plugs 41, the supporting spacers 42, and the second contact plugs 43 may be located in the contact region CT and dispersed across the first and second contact regions CT1 and CT2. For example, the second contact plugs 43 arranged in the first contact region CT1 may be coupled to upper selection lines, and the second contact plugs 43 arranged in the second contact region CT2 may be coupled to a word line.

The supporting plugs 41 and the supporting spacers 42 may support the stacked structure ST by preventing the tilting or collapse of the stacked structure ST during manufacturing processes. In addition, the supporting spacers 42 located in the first contact region CT1 may be coupled to the isolation pattern 18. The conductive layers 11 at both sides may be separated from each other by the isolation pattern 18 and the supporting spacers 42 coupled to each other.

The second contact plugs 43 may be provided to apply a bias voltage to the conductive layers 11 included in the stacked structure ST, respectively. The second contact plugs 43 may be electrically connected to the conductive layers 11, respectively. The second contact plugs 43 may be located at space between the supporting plugs 41 and the first contact plugs 13. For example, the second contact plugs 43 may be located between the insulating spacer 14 and the supporting spacer 42, at concave portions of the insulating spacers 14 coupled to each other, or at concave portions of the supporting spacers 42 coupled to each other.

The arrangement of the supporting plugs 41 located in the contact region CT, or the number of supporting spacers 42 coupled to each other may vary.

FIGS. 7A to 7D are layout views illustrating the structure of a semiconductor device in accordance with an embodiment. Hereinafter, any repetitive detailed description of components already mentioned above will be omitted.

Referring to FIG. 7A, a semiconductor device in accordance with an embodiment may include the stacked structure ST, the first contact plugs 13, the insulating spacers 14, the supporting plugs 41, the supporting spacers 42, the second contact plugs 43, the isolation patterns 18, a first slit insulting layer 19A, a second slit insulating layer 19B, and dielectric layers 45.

The stacked structure ST may include the conductive layers 11 and insulating layers (not illustrated) stacked alternately with each other. In some areas of the stacked structure ST, the dielectric layers 45 and the insulating layers may be alternately stacked on each other. The dielectric layers 45 may be residual sacrificial layers during manufacturing processes of the semiconductor device. For example, when sacrificial layers and insulating layers are stacked alternately with each other and the sacrificial layers are replaced by the conductive layers 11, portions of the sacrificial layers may remain. As a result, the dielectric layers 45 may be located at the same levels as the conductive layers 11.

Some of the first contact plugs 13 may overlap the dielectric layers 45. For example, some of the first contact plugs 13 may be located at the boundary between the dielectric layer 45 and the conductive layer 11, or in the dielectric layer 45. The first contact plug 13 located in the dielectric layer 45 may pass through the dielectric layers 45 and the insulating layers 45 stacked alternately with each other.

The supporting plugs 41 may be arranged next to each other in the first direction I-I' or the second direction II-II'. The supporting spacers 42 corresponding to the supporting plugs 41 arranged next to each other may be coupled to each other. In addition, the supporting plugs 41 and the supporting spacers 42 may overlap the dielectric layer 45.

For example, the supporting plugs 41 located in the first contact region CT1 may be arranged next to each other in the second direction II-II' and the supporting spacers 42 corresponding thereto may be coupled to each other. Therefore, in the contact region CT1, upper selection lines at the same levels may be separated from each other by the supporting spacers 42 and the supporting plugs 41.

The supporting plugs 41 and the supporting spacers 42 may be formed before or after the isolation patterns 18 are formed. When the supporting plugs 41 and the supporting spacers 42 are formed prior to forming the isolation patterns 18, the isolation patterns 18 may be extended into the supporting spacers 42, or both the supporting spacers 42 and the supporting plugs 41.

The second slit insulating layer 19B may be located at the boundary between neighboring memory blocks MB. In addition, the dielectric layers 45 may be located at the boundary between the neighboring blocks MB. Therefore, by coupling the second slit insulating layer 19B and the dielectric layer 45 to each other, the neighboring memory blocks MB may be insulated from each other.

In addition, at least one supporting plug 41 and at least one supporting spacer 42 may be interposed between the dielectric layer 45 and the second slit insulating layer 19B. For example, the supporting plugs 41 and the supporting spacers 42 arranged next to each other in the first direction I-I' may be located between the dielectric layer 45 and the second slit insulating 19B, and the second slit insulating layer 19B may overlap the supporting plug 41 and the supporting spacer 42. In this example, the neighboring memory blocks MB may be electrically insulated from each other by the dielectric layers 45, the supporting spacers 42, the supporting plugs 41, and the first slit insulating layer 19B. In addition, an overlay margin may be ensured by arranging the supporting plugs 41 and the supporting spacers 42 located between the dielectric layer 45 and the second slit insulating layer 19B in a direction crossing the second slit insulating layer 19B.

The first slit insulating layer 19A may be located in the memory block MB. For example, the first slit insulating layer 19A may be formed by filling an insulting layer in a slit serving as a path for replacing the sacrificial layers with the conductive layers 11. Therefore, the dielectric layer 45 may be spaced apart from the first slit insulating layer 19A at a predetermined distance, and the conductive layer 11 may be located between the dielectric layer 45 and the first slit insulating layer 19A.

Figure 7B:
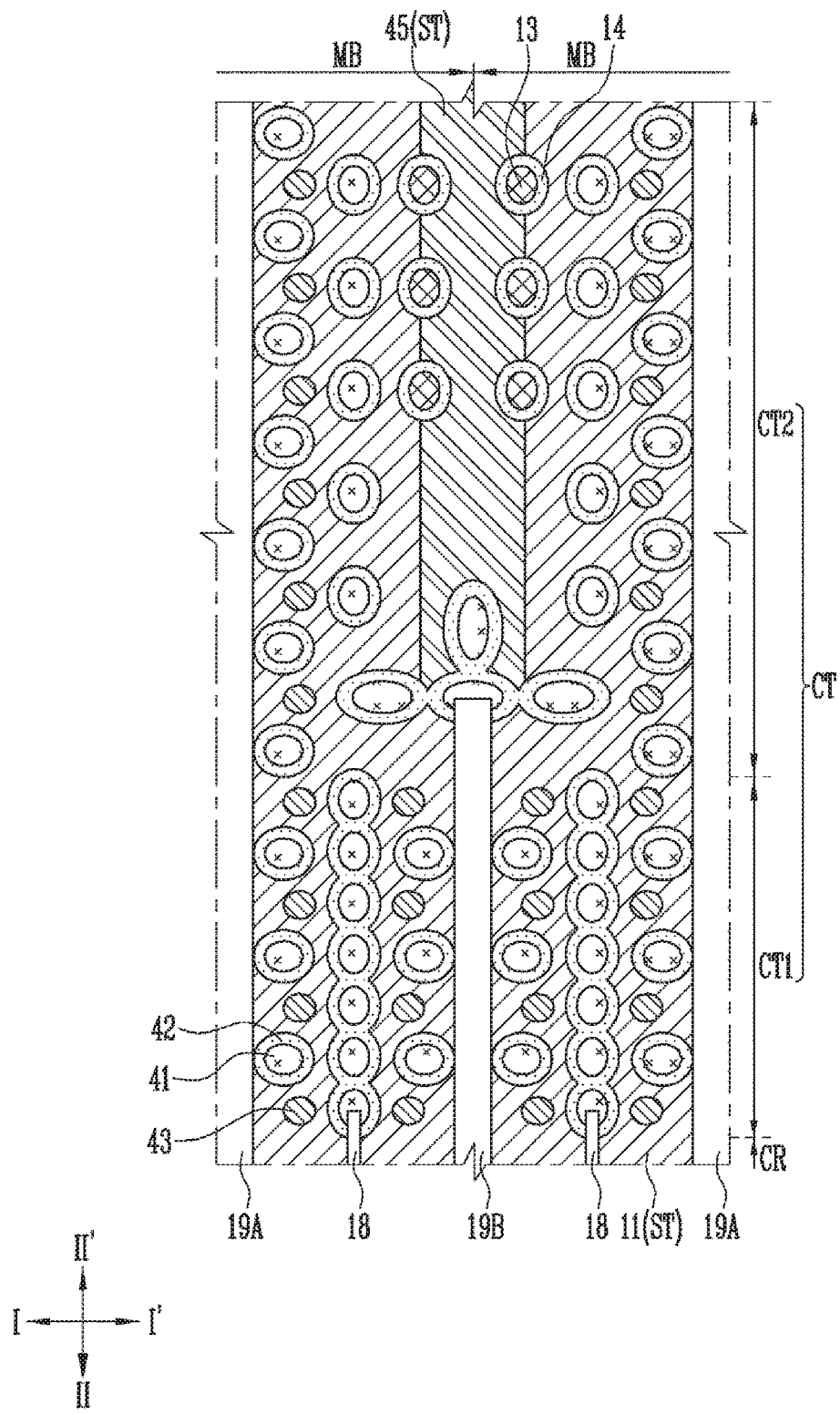

Referring to FIG. 7B, the supporting plugs 41 may be located adjacent to each other in the first direction I-I' and the second direction II-II', and the supporting spacers 42 corresponding thereto may be coupled to each other. For example, the supporting plugs 41 may be arranged in a T shape or a cross shape, and the supporting spacers 42 thereof may be coupled to each other.

Figure 7C:
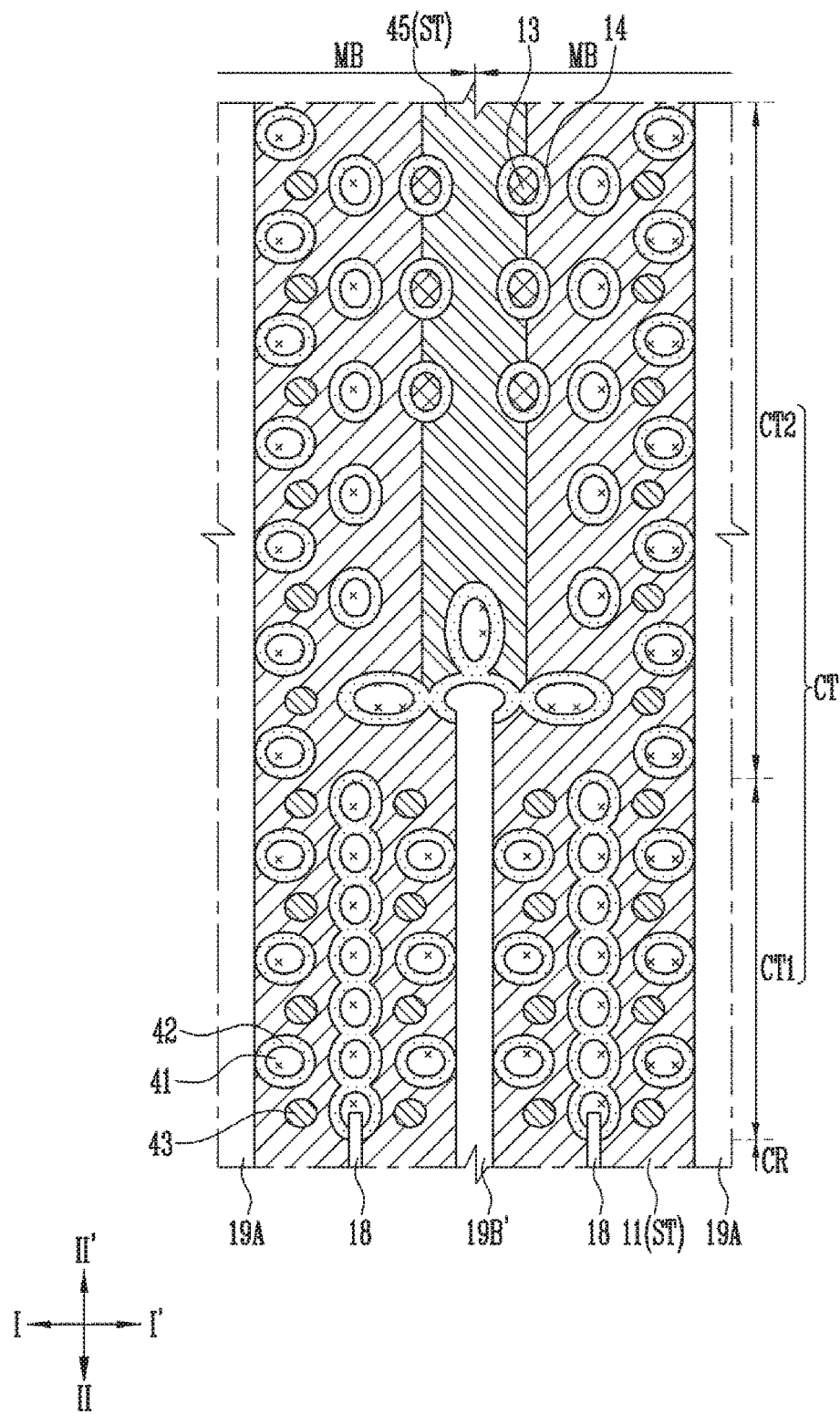

Referring to FIG. 7C, when the supporting spacer 42 and a second slit insulating layer 19B' overlap each other, the second slit insulating layer 19B' may be extended into the supporting spacer 42. Thus, the supporting spacer 42 may surround an end portion of the second slit insulating layer 19B'. In addition, the end portion of the second slit insulating layer 19B' may have a similar shape to the supporting plug 41 and may be extended to a predetermined width.

Figure 7D:
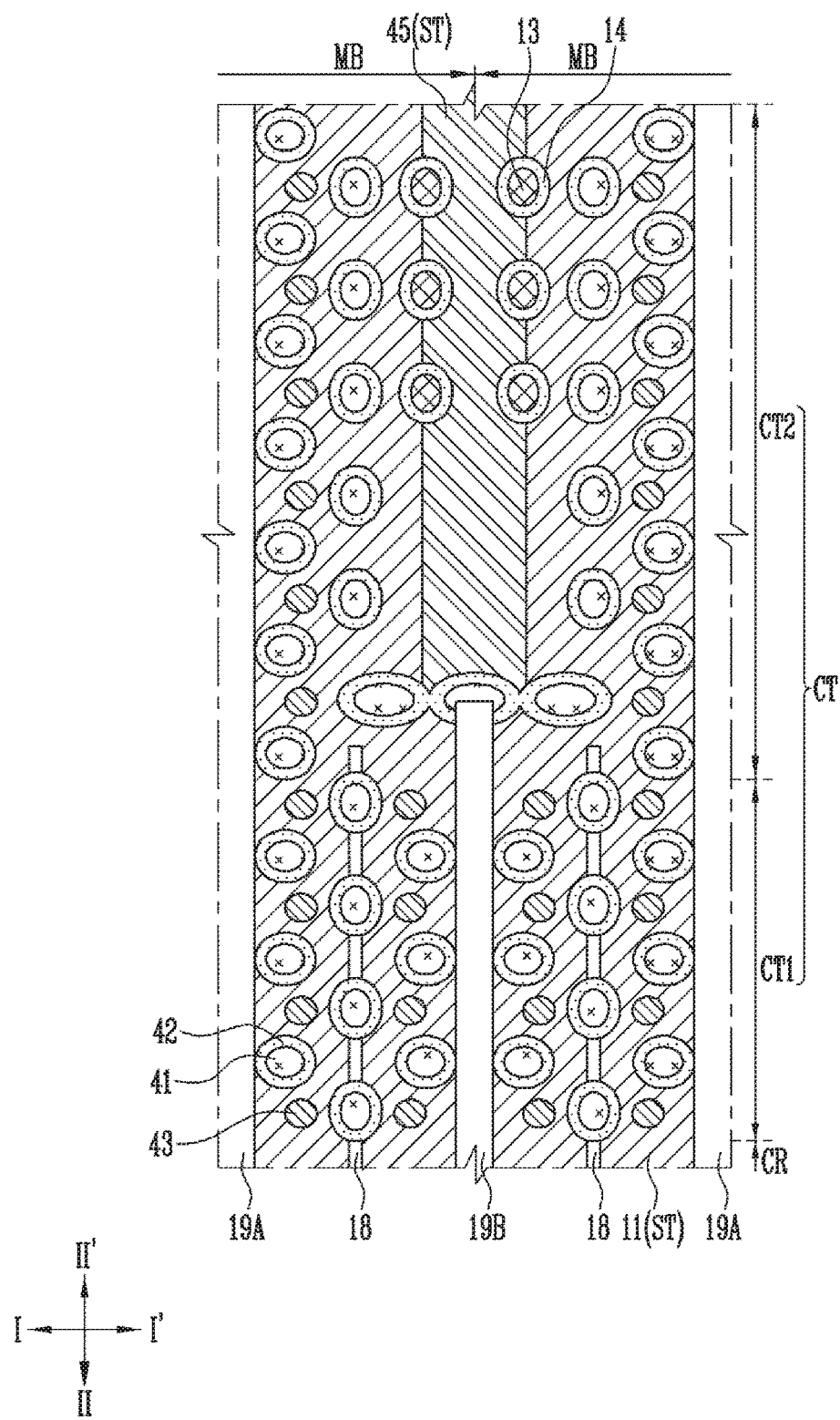

Referring to FIG. 7D, the isolation patterns 18 in the cell region CR may be extended to the contact region CT. For example, the isolation patterns 18 may be extended at least to the first contact region CT1 and overlap the supporting plugs 41 and the supporting spacers 42. In this example, the supporting plugs 41 and the supporting spacers 42 arranged next to each other in the second direction II-II' may be coupled to each other by the isolation patterns 18. Therefore, in the first contact region CT1, upper selection lines at the same levels may be separated from each other by the isolation patterns 18, the supporting spacers 42, and the supporting plugs 41. The supporting plugs 41 and the supporting spacers 42 may be formed after the isolation patterns 18 are formed.

Figure 8A:
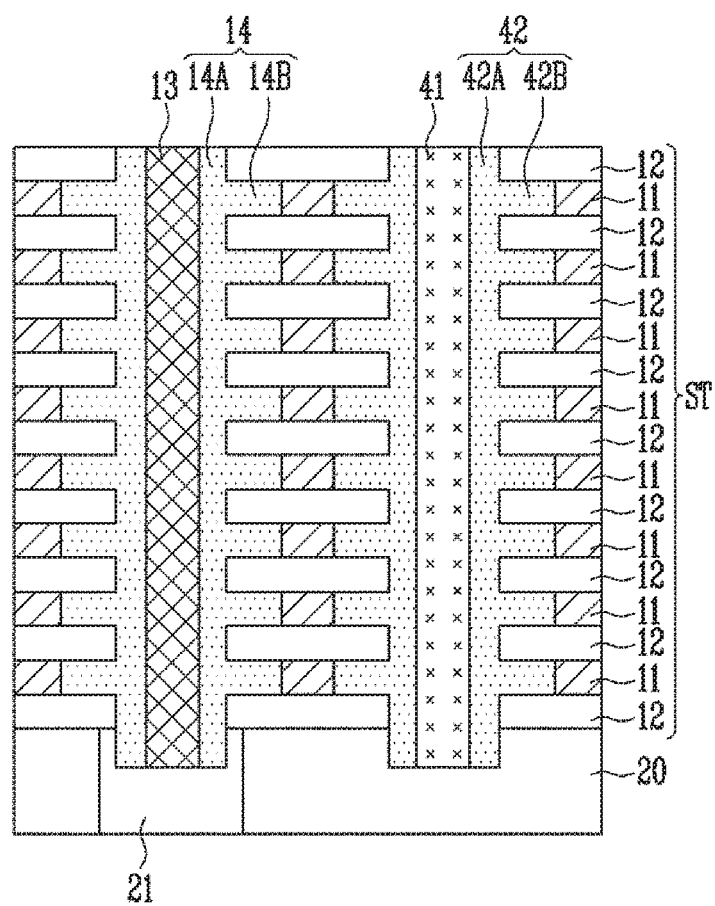
Figure 8B:
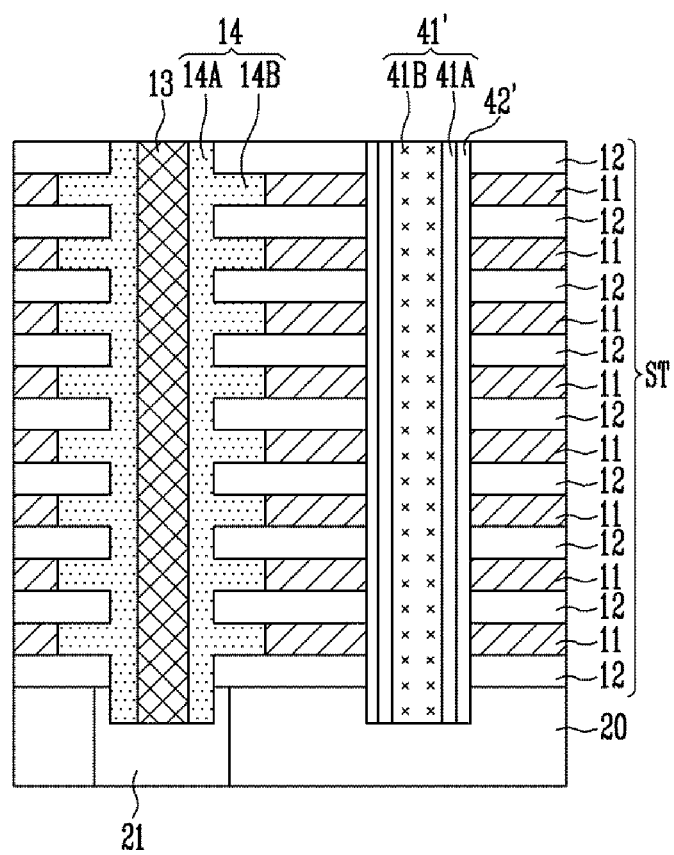

FIGS. 8A to 8C are cross-sectional views illustrating the structure of a semiconductor device in accordance with an embodiment. More specifically, FIGS. 8A and 8B show the structures of the supporting plugs 41 and the supporting spacers 42. Hereinafter, any repetitive detailed description of components already mentioned above will be omitted.

Referring to FIG. 8A, the supporting plugs 41 may have a similar structure to the first contact plugs 13, and the supporting spacers 42 may have a similar structure to the insulating spacers 14. In other words, the supporting plugs 41 may have material and structure corresponding to the first contact plugs 13, and the supporting spacers 42 may have material and structure corresponding to the insulating spacers 14. For example, the supporting plugs 41 may include a conductive material such as tungsten or polysilicon. In addition, each of the supporting plugs 41 may be formed as a single layer or may include multiple layers.

Each of the supporting spacers 42 may include loop patterns 42B surrounding each of the supporting plugs 41 and stacked along a sidewall of each of the supporting plugs 41. In addition, each of the supporting spacers 42 may include a coupling pattern 42A surrounding the sidewall of each of the supporting plugs 41 and coupling the loop patterns 42B. Therefore, the plurality of loop patterns 42B of each of the supporting spacers 42 may protrude from the coupling pattern 42A. The loop patterns 42B may be located at levels corresponding to the conductive layers 11. In addition, neighboring supporting spacers 42 may be coupled to each other. The loop patterns 42B of neighboring supporting spacers 42 may be coupled to each other.

In addition, the loop patterns 42B of the supporting spacers 42 may be located at the same levels as the loop patterns 14B of the insulating spacers 14. Therefore, the loop patterns 42B of the supporting spacers 42 and the loop patterns 14B of the insulating spacers layers 14 may be coupled to each other.

The supporting plugs 41 may have the same or different depths from the first contact plugs 13. In addition, the supporting plugs 41 and the first contact plugs 13 may be coupled to different lower structures. As described above with reference to FIG. 5, the first contact plugs 13 may be coupled to the wiring structure located under the stacked structure ST. The first contact plugs 13 may be electrically connected to the pad 21 of the first substrate 20, or may pass through the first substrate 20 to be directly coupled to the wiring structure. On the other hand, the supporting plugs 41 may not pass through the first substrate 20 or may not be coupled to the pad 21. In this example, a bias may not be applied to the supporting plugs 41. The supporting plugs 41 may serve as a support without establishing any electrical connection. Alternatively, the supporting plugs 41 may have a floating state.

Referring to FIG. FIG. 8B, supporting plugs 41' and supporting spacers 42' may have a similar structure to the channel structures CH. For example, each of the supporting plugs 41' may include a semiconductor layer 41A corresponding to the channel layer 15A and an insulating layer 41B corresponding to the gap-filling insulating layer 17A. In addition, each of the supporting spacers 42' may have material and structure corresponding to the memory layer 16A. However, the supporting plugs 41' may not be coupled to wires such as a bit line, or the supporting plugs 41' may be coupled to the first substrate 20.

As shown in FIG. 8B, the semiconductor layer 41A and the supporting spacer 42' may not be formed on a bottom surface of the insulating layer 41B. However, the structures of the semiconductor layer 41A and the supporting spacer 42' may be modified. For example, either or both of the semiconductor layer 41A and the supporting spacer 42' may be formed to surround the bottom surface of the insulating layer 41B.

Referring to FIG. 8C, the semiconductor device may include only supporting spacers 42" without supporting plugs. For example, when an opening for a support has a smaller width than an opening for a contact plug (W2<W1), the opening for a support may be completely filled with the supporting spacers 42''. Each of the supporting spacers 42'' may include a single layer or multiple layers.

As described above with reference to FIG. 7C, the supporting plugs 41 may have a material corresponding to the second slit insulating layer 19B. Therefore, the supporting plugs 41 may include a conductive material, such as tungsten, polysilicon, or metal, a semiconductor material, such as silicon (Si) or germanium (Ge), an insulating material, such as an oxide or a nitride, or a combination thereof.

FIGS. 9A to 13A and FIGS. 9B to 13B illustrate a method of manufacturing a semiconductor device in accordance with an embodiment. FIGS. 9A to 13A are layout views, and FIGS. 9B to 13B are cross-sectional views. Hereinafter, any repetitive detailed description of components already mentioned above will be omitted.

Figure 9A:
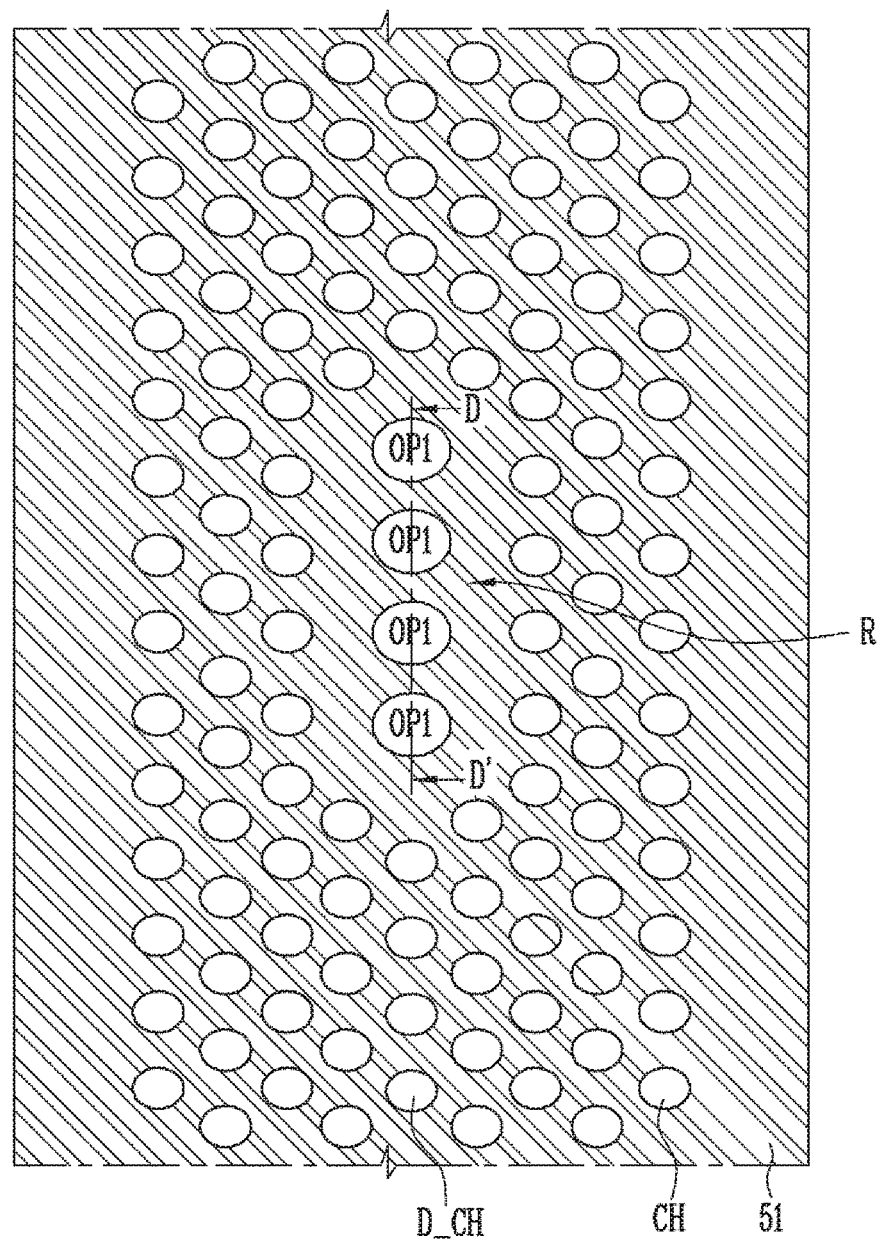
Figure 9A:
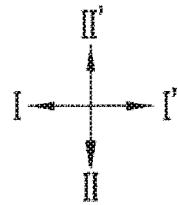

Referring to FIGS. 9A and 9B, the stacked structure ST may include first material layers 51 and second material layers 52 stacked alternately with each other. The first material layers 51 may be provided to form gate electrodes of memory cells and selection transistors. The second material layers 52 may be provided to insulate the stacked gate electrodes from each other.

The first material layers 51 may include a material having high etch selectivity to the second material layers 52. For example, each of the first material layers 51 may be a sacrificial layer including a nitride and each of the second material layers 52 may be an insulating layer including an oxide. In another example, each of the first material layers 51 may be a conductive layer including polysilicon and tungsten, and each of the second material layers 52 may be an insulating layer including an oxide. In another example, each of the first material layers 51 may be a conductive layer including doped polysilicon, and each of the second material layers 52 may be a sacrificial layer including undoped polysilicon.

Though not shown in FIGS. 9A and 9B, a lower structure may be formed prior to forming the stacked structure ST. For example, the wiring structure described above with reference to FIG. 5B may be formed first.

Subsequently, the channel structures CH passing through the stacked structure ST may be formed. Each of the channel structures CH may have the structure described above with reference to FIG. 1C. For example, after channel holes are formed through the stacked structure ST, a memory layer, a channel layer, and a gap-filling insulating layer may be sequentially formed in the channel holes, thereby forming the channel structures CH. The gap-filling insulating layer may be recessed into a predetermined thickness, and a plug may be formed in the recessed region. In addition, the dummy channel structures D_CH may also be formed when the channel structures CH are formed.

The channel structures CH may be arranged in the first direction I-I' and the second direction II-II', and the dummy channel structures D_CH may be located between the channel structures CH. The arrangements of the channel structures CH and the dummy channel structures D_CH may be determined in consideration of structures to be formed during subsequent processes. For example, in the example of FIG. 9A, channel structures CH and dummy channel structures D_CH are not formed in a region R where contact plugs and insulating spacers are formed. However, the invention may not be limited in this way and in another embodiment channel structures CH and dummy channel structures D_CH may be formed in the region R. In this arrangement, the insulating spacers may contact the channel structures CH or the dummy channel structures D_CH.

The supporting plugs 41 and the supporting spacers 42 described above with reference to FIGS. 5 and 6 may be formed at the same time as the channel structures CH are formed. Thus, the supporting plugs 41 and the supporting spacers 42 may be structured as described above with reference to FIG. 8B.

Subsequently, first openings OP1 may be formed through the stacked structure ST. The first openings OP1 may have a cross-sectional shape such as a circle, an oval, a rectangle, and a polygon, and may be formed into the shape of a hole. The first openings OP1 may be located in the region R and be arranged at a predetermined distance. For example, the first openings OP1 may be located between the channel structures CH adjacent to each other in the first direction I-I' and be arranged in the second direction II-II'.

In addition, in this embodiment, the first openings OP1 may be located in the cell region. However, the first openings OP1 may be located in the contact region. Alternatively, the first openings OP1 may be located in the boundary between adjacent memory blocks.

Figure 10A:
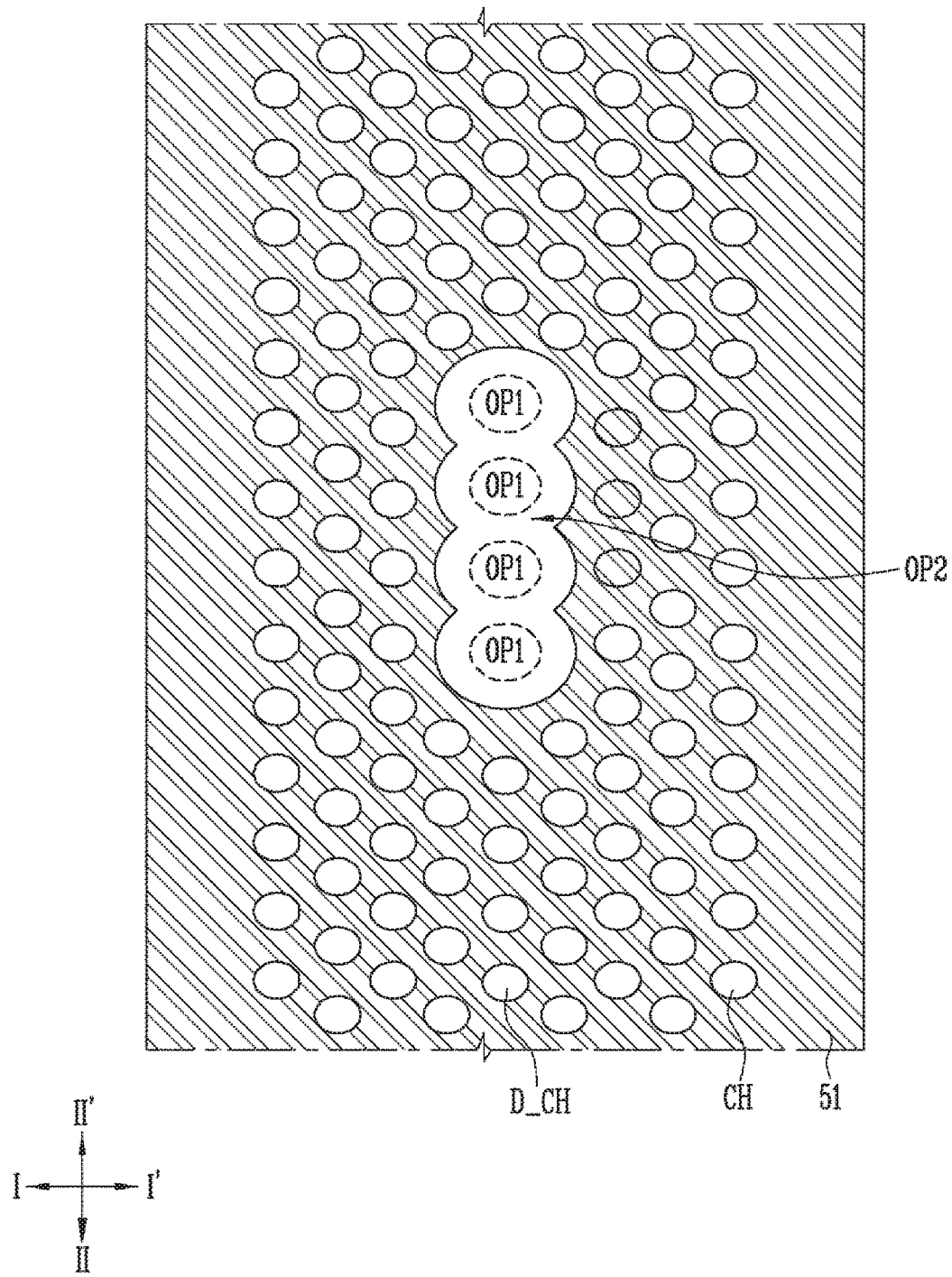
Figure 10B:
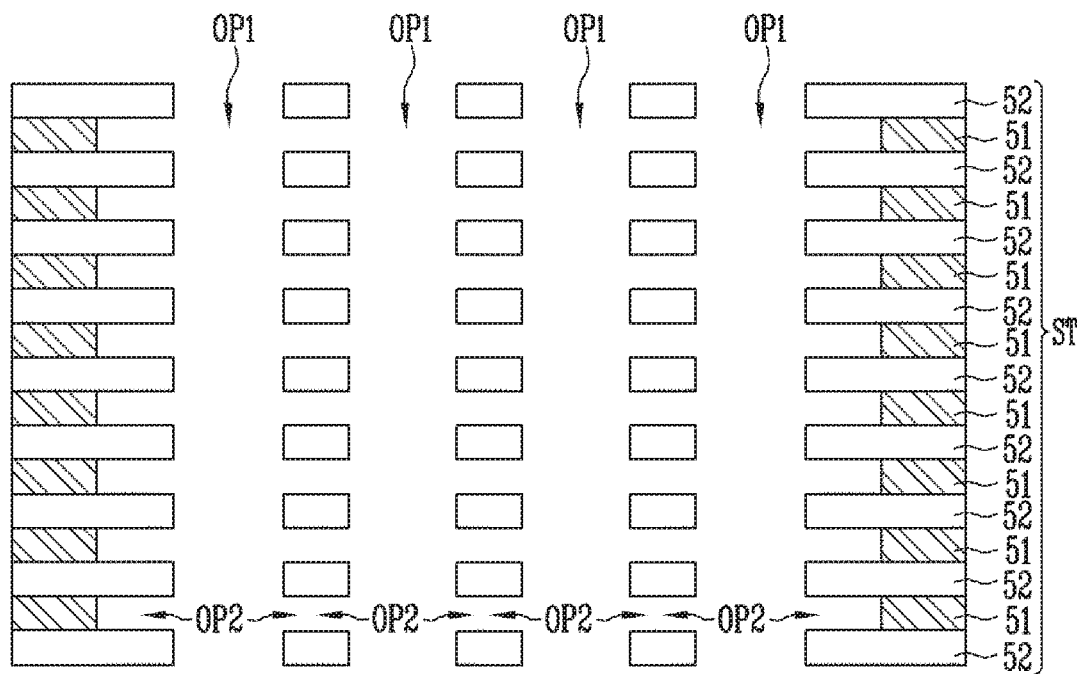

Referring to FIGS. 10A and 10B, the first material layers 51 exposed through the first openings OP1 may be etched to a predetermined thickness to form second openings OP2. Since the first material layers 51 are selectively etched, the second openings OP2 may protrude from the first openings OP1.

The second openings OP2 of neighboring openings OP1 may be coupled to or decoupled from each other according to the etch depth of the first material layers 51 or the space between the first openings OP1. For example, the etch depth of the first material layers 51 may be controlled so as to couple the second openings OP2 of neighboring first openings OP1 to each other. By etching the first material layers 51 to a greater depth, the second openings OP2 located at the same levels as the first material layers 51 may be coupled to each other. For example, the etch depth of the first material layers 51 may be controlled so as to separate the second openings OP2 of neighboring first openings OP1 from each other. By etching the first material layers 51 to a smaller depth, the second openings OP2 located at the same levels as the first material layers 51 may be separated from each other. In another example, by controlling the distance between the first openings OP2 to be a smaller value, the second openings OP2 may be coupled to each other, or by controlling the distance of the first openings OP1 to be a greater value, the second openings OP2 may be separated from each other.

Figure 11B:
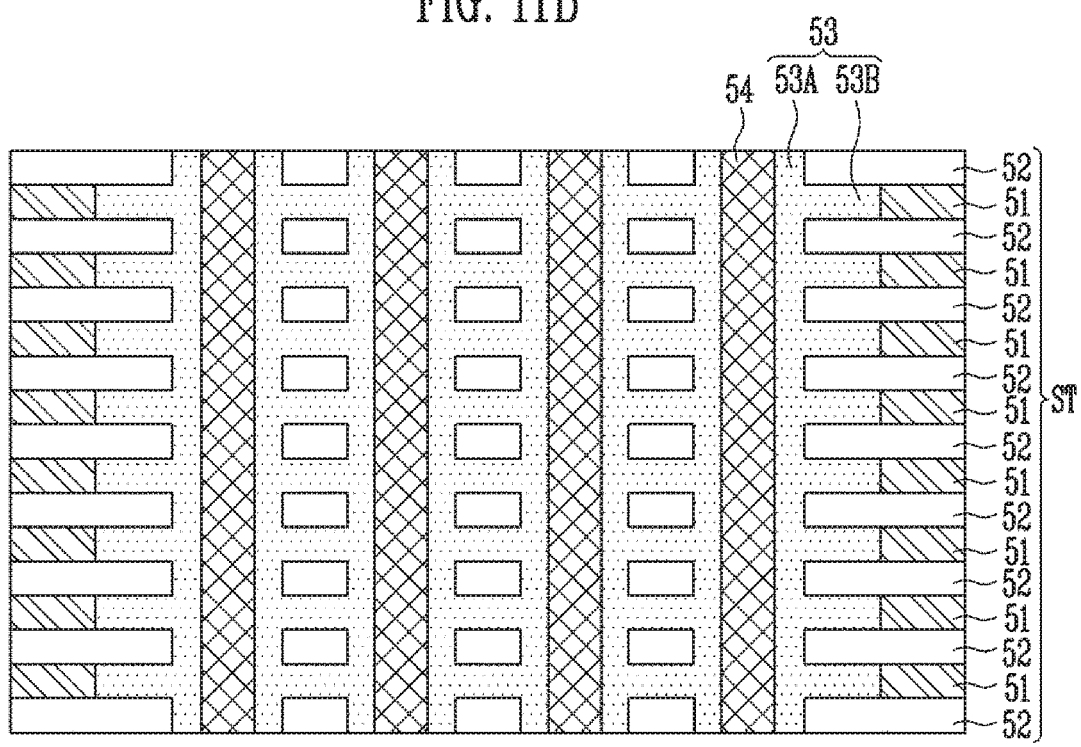

Referring to FIGS. 11A and 11B, contact plugs 54 and insulating spacers 53 surrounding the contact plugs 54, respectively, may be formed. First, a spacer insulating layer may be formed in the first openings OP1 and the second openings OP2. The spacer insulating layer may fill the second openings OP2 and be formed along inner surfaces of the first openings OP1. Subsequently, portions of the spacer insulating layer formed on lower surfaces of the first openings OP1 may be removed to form the insulating spacers 53. Each of the insulating spacers 53 may include a coupling pattern 53A and loop patterns 53B in the second openings OP2. Subsequently, the contact plugs 54 may be formed in the first openings OP1.

The supporting plugs 41 and the supporting spacers 42 described above with reference to FIGS. 6 and 7 may be formed at the same time as the contact plugs 54 and the insulating spacers 53 are formed. Thus, the supporting plugs 41 and the supporting spacers 42 may be structured as described above with reference to FIG. 8A.

Figure 12A:
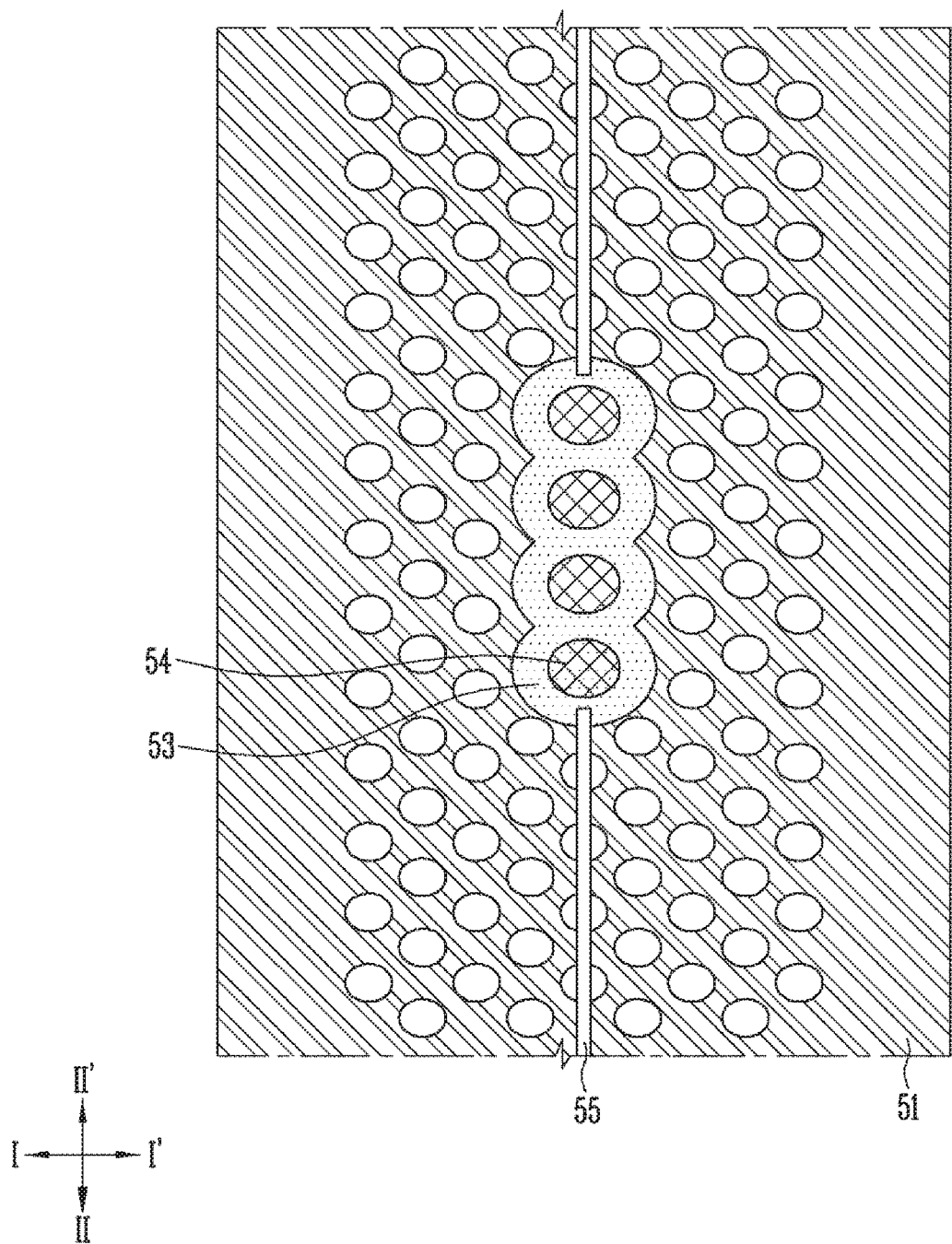
Figure 12B:
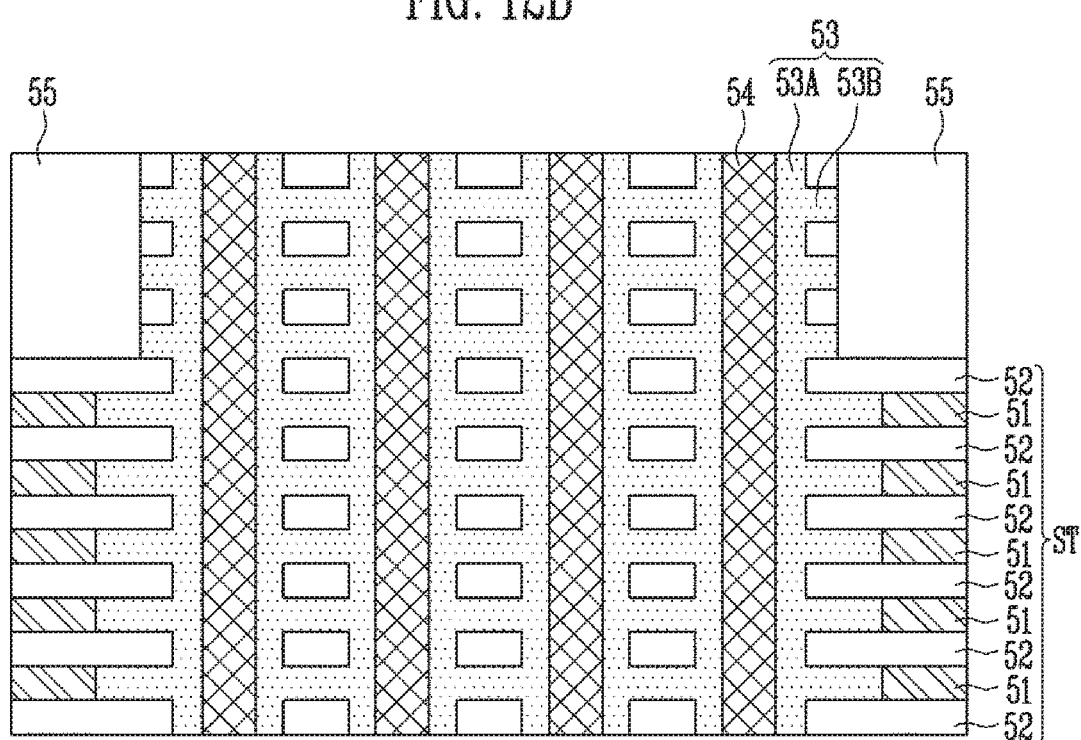

Referring to FIGS. 12A and 12B, an isolation pattern 55 may partially pass through the stacked structure ST. For example, the isolation pattern 55 may be deep enough to pass through at least one first material layer 51. For example, the isolation pattern 55 may have a linear shape extending in the second direction II-II'. In addition, the isolation pattern 55 may overlap the contact plugs 54 and the insulating spacers 53.

In this embodiment, the isolation pattern 55 may be formed after the contact plugs 54 and the insulating spacers 53 are formed. However, the manufacturing order may be changed. For example, the contact plugs 54 and the insulating spacers 53 may be formed after the isolation pattern 55 is formed.

Figure 13A:
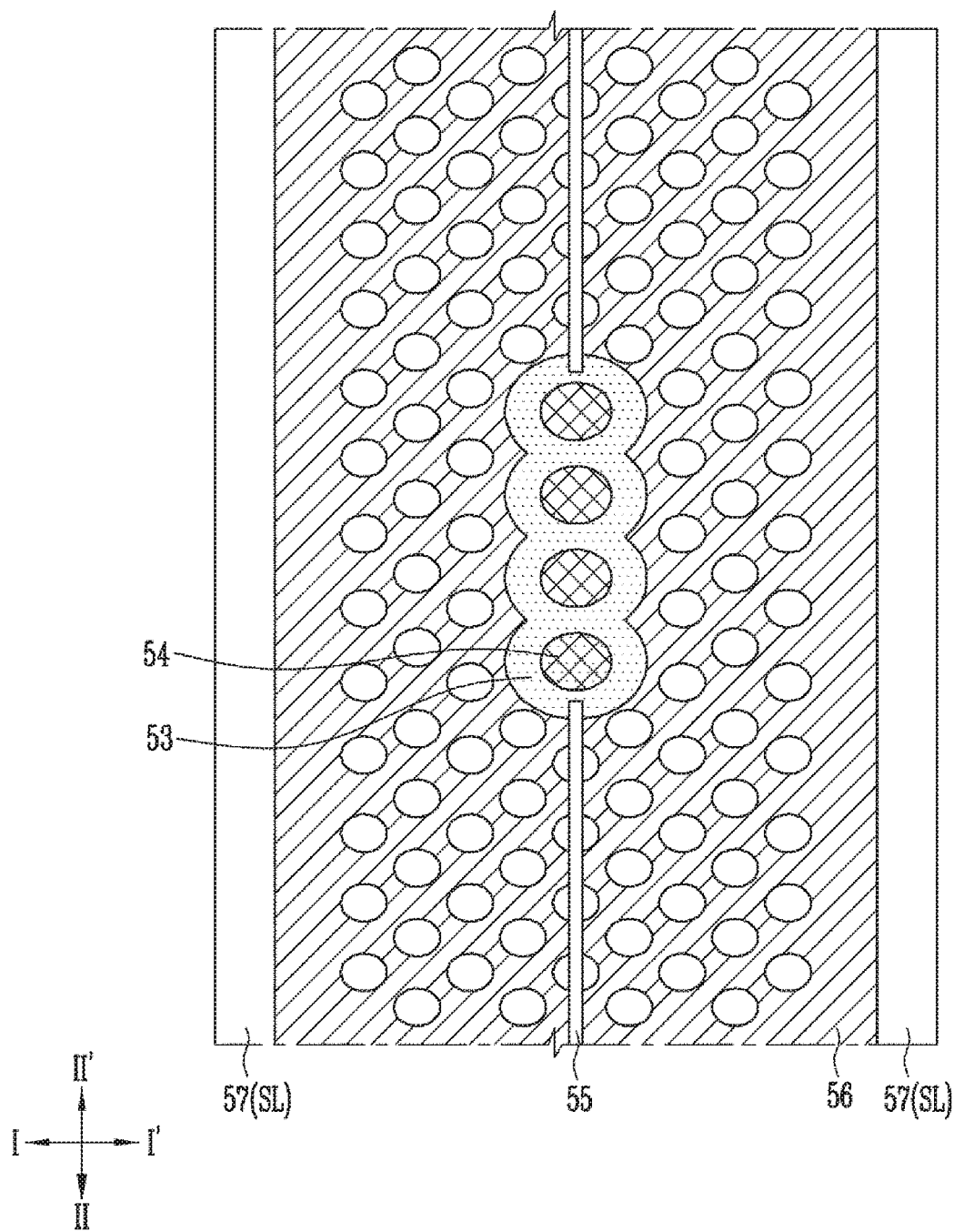
Figure 13B:
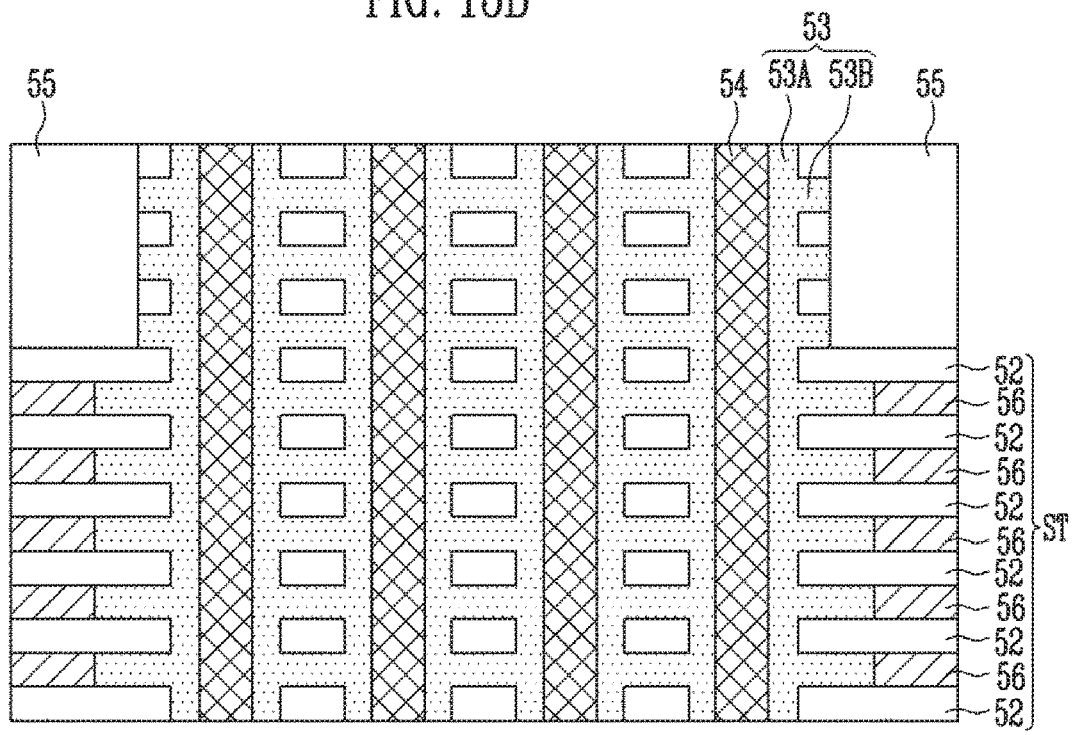

Referring to FIGS. 13A and 13B, after slits SL are formed through the stacked structure ST, the first material layers 51 exposed through the slits SL may be removed. Portions of the first material layers 51 may remain depending on the distance from the slits SL. For example, the first material layers 51 closer to the slits SL may be removed, whereas the first material layers 51 farther away from the slit SL may remain. Therefore, as in the embodiment described above with reference to FIG. 3B, the first material layers 51 interposed between the loop patterns 53B may remain.

The first material layers 51 may be selectively etched, while the second material layers 52 may remain. Therefore, the remaining second material layers 52 may be supported by the previously formed vertical structures. For example, the remaining second material layers 52 may be supported by the channel structures CH, the dummy channel structures D_CH, the supporting plugs, the supporting spacers, the contact plugs 54, and the insulating spacers 53.

The insulating spacers 53 may include the loop patterns 53B on the sidewalls, and the loop patterns 53B may protrude between the remaining second material layers 52. Therefore, the loop patterns 53B may be interposed between the stacked second material layers 52 to stably support the second material layers 52.

Subsequently, conductive layers 56 may be formed in regions from which the first material layers 51 are removed. Before the conductive layers 56 are formed, a memory layer may be further formed in the regions from which the first material layers 51 are removed. Subsequently, slit insulating layers 57 may be formed in the slits SL.

Processes of replacing the first material layers 51 by the conductive layers 56 may be changed depending on materials of the first material layers 51 and the second material layers 52. For example, when the first material layers 51 are conductive layers and the second material layers 52 are insulating layers, the first material layers 51 may be silicided. In another example, when the first material layers 51 are conductive layers and the second material layers 52 are sacrificial layers, the second material layers 52 may be replaced by insulating layers.

A method of forming contact plugs and insulating spacers in accordance with the embodiment of FIGS. 1A and 1B has been described. However, we note that the described manufacturing method is just one exemplary embodiment of the manufacturing method according with the present invention and many modifications may be made by a skilled person after having read the present disclosure without departing from the scope of the invention.

Figure 14A:
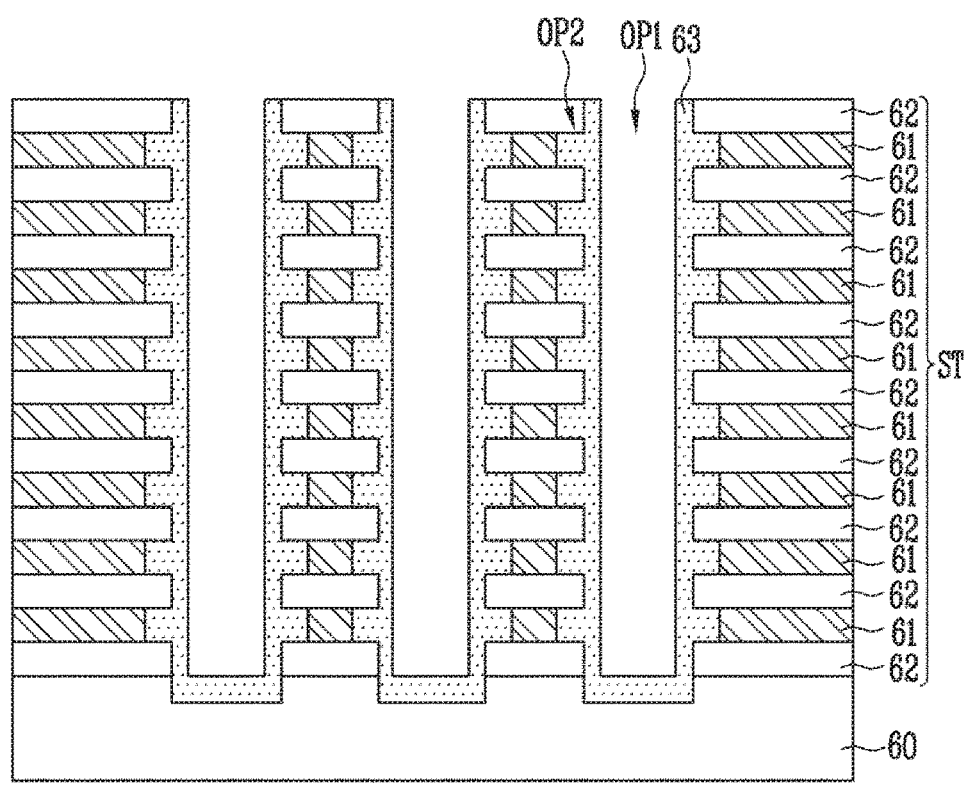
FIGS. 14A to 14C are cross-sectional views illustrating a method of manufacturing a semiconductor device in accordance with an embodiment.
Figure 14B:
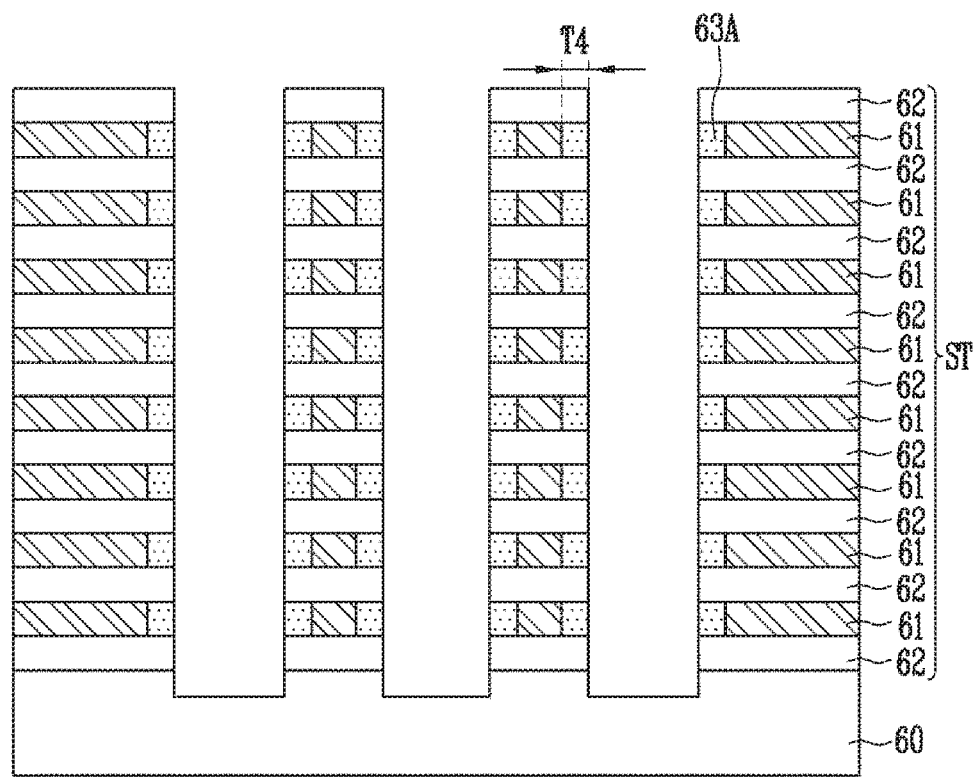
Figure 14C:
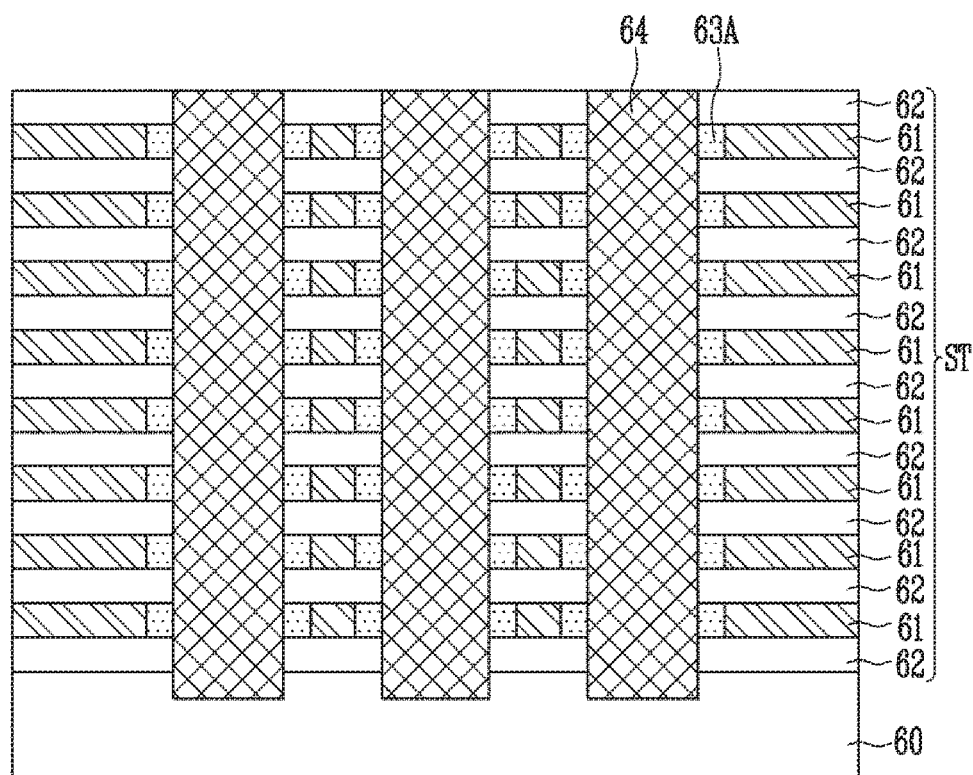

FIGS. 14A to 14C are cross-sectional views illustrating a method of manufacturing a semiconductor device in accordance with an embodiment. Hereinafter, any repetitive detailed description of components already mentioned above will be omitted.

Referring to FIG. 14A, the stacked structure ST including first material layers 61 and second material layers 62 stacked alternately on each other may be formed on a substrate 60. Subsequently, first openings OP1 are formed through the stacked structure ST, and then the first material layers 61 which are exposed through the first openings OP1 may be partially etched to form the second openings OP2. The second openings OP2 of neighboring first openings OP1 may be coupled to or separated from each other depending on an etch depth of the first material layers 61 or spacing between the first openings OP1.

Spacer insulating layers 63 may be formed in the first openings OP1 and the second openings OP2. The spacer insulating layers 63 may fill the second openings OP2 and be formed on inner surfaces of the first openings OP1. In addition, each of the spacer insulating layers 63 may include a first area formed in the first opening OP1 and a second area formed in the second openings.

Referring to FIG. 14B, areas of the spacer insulating layers 63 formed in bottom surfaces of the first openings OP1 may be removed. For example, the spacer insulating layers 63 may be etched by a cleaning process such as a dry cleaning process. As a result, areas of the spacer insulating layers 63 formed on inner walls of the first openings OP1 as well as the areas formed in the bottom surfaces of the first openings OP1 may be removed. In other words, first areas of the spacer insulating layers 63 may be completely removed while the second areas thereof may remain. Accordingly, loop patterns 63A located in the second openings OP2, respectively, may be formed.

When the first areas of the spacer insulating layers 63 are completely removed, the second material layers 62 of the stacked structure ST may be exposed. The exposed second material layers 62 may also be etched to a predetermined thickness when the spacer insulating layers 63 are etched. Thus, a thickness T4 of the loop patterns 63A may be reduced.

Referring to FIG. 14C, contact plugs 64 may be formed in the first openings OP1. Though not shown in FIG. 14C, the above-described isolation patterns, slits and conductive layers may be formed.

In addition, in this embodiment, the methods of forming the contact plugs and the spacers in accordance with the embodiments described with reference to FIGS. 2C and 3C are described. However, the manufacturing methods may be changed with reference to other embodiments.

Figure 15A:
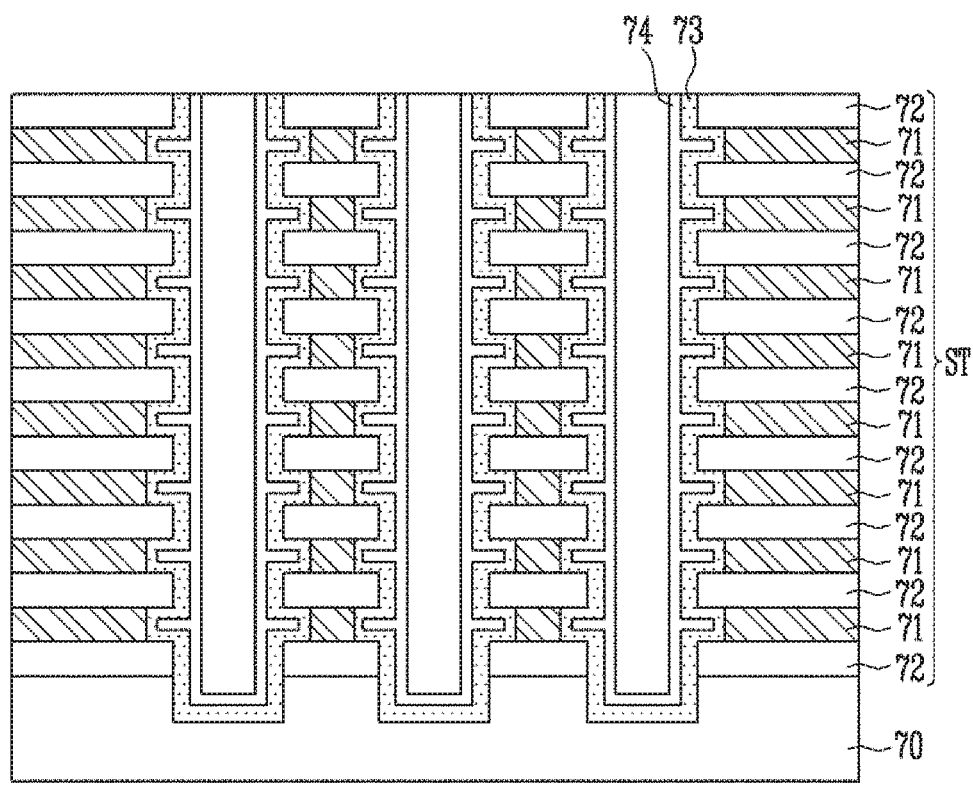
FIGS. 15A to 15C are cross-sectional views illustrating a method of manufacturing a semiconductor device in accordance with an embodiment.
Figure 15B:
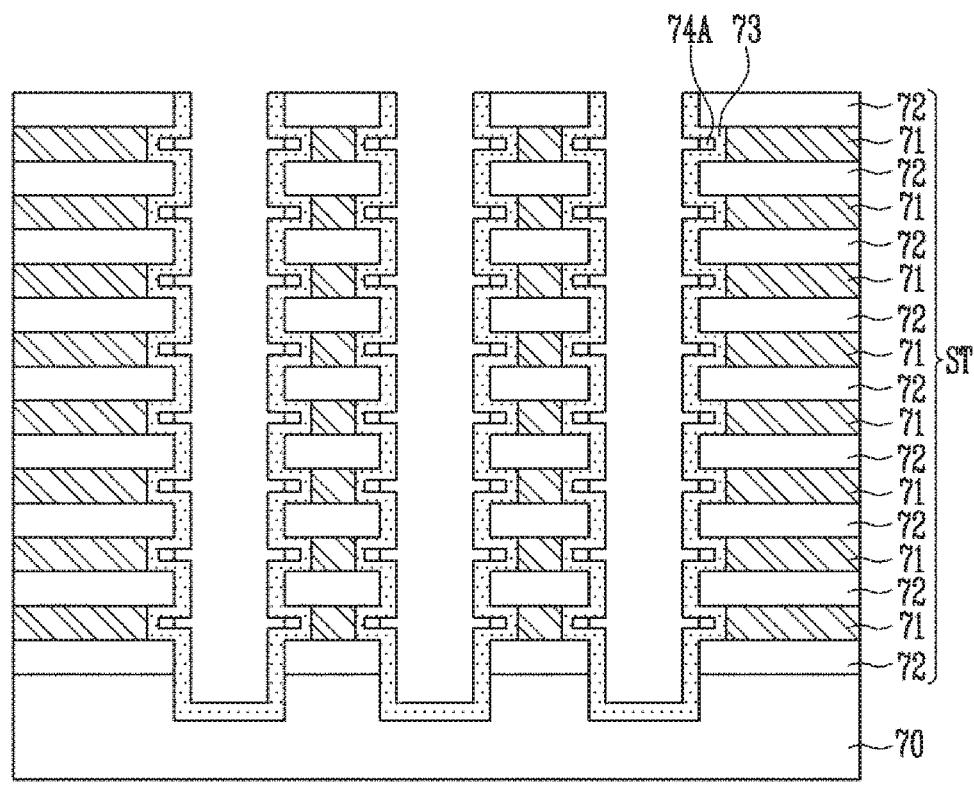
Figure 15C:
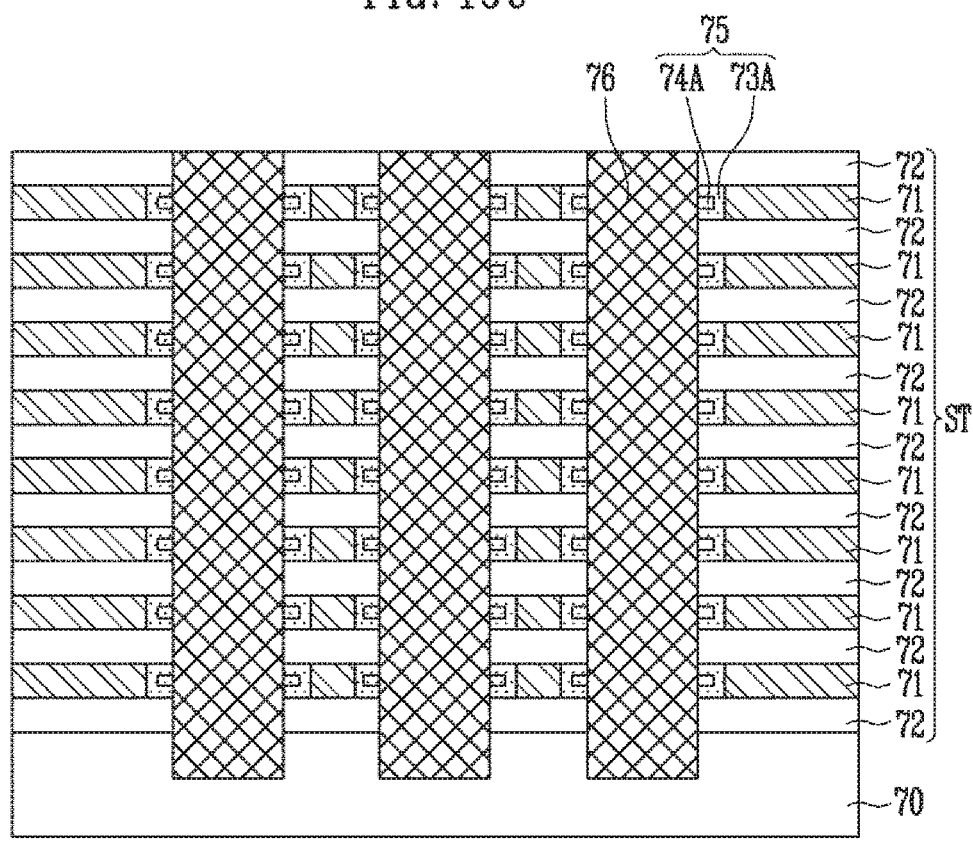

FIGS. 15A to 15C are cross-sectional views illustrating a method of manufacturing a semiconductor device in accordance with an embodiment. Hereinafter, any repetitive detailed description of components already mentioned above will be omitted.

Referring to FIG. 15A, the stacked structure ST including first material layers 71 and second material layers 72 stacked alternately on each other may be formed on a substrate 70. After the first openings OP1 are formed through the stacked structure ST, the first material layers 71 exposed through the first openings OP1 may be partially etched to form the second openings OP2. The second openings OP2 of neighboring openings OP1 may be coupled to or separated from each other depending on an etch depth or spacing between the first openings OP1.

Subsequently, first insulating layers 73 may be formed in the first and second openings OP1 and OP2. The first insulating layers 73 may be formed on inner surfaces of the first and second openings OP1 and OP2 and may not completely fill the second openings OP2.

Second insulating layers 74 may be formed on the first insulating layers 73. The second insulating layers 74 may be formed in the first and second openings OP1 and OP2 and completely fill the second openings OP2. The second insulating layers 74 may including a material having a high etch selectivity to the first insulating layers 73. For example, the first insulating layers 73 may be oxide layers and the second insulating layers 74 may be nitride layers.

Referring to FIG. 15B, the second insulating layers 74 may be selectively etched to form second insulating patterns 74A. For example, areas of the second insulating layers 74 formed in the first openings OP1 may be etched by a dry cleaning process. As a result, second insulating patterns 74A located in the second openings OP2, respectively, may be formed.

Referring to FIG. 15C, the first insulating layers 73 may be etched using the second insulating patterns 74B as an etch barrier. For example, the first insulating layers 73 may be selectively etched using a wet etch process or a dry cleaning process. Since areas of the first insulating layers 73 formed in the second openings OP2 are protected by the second insulating patterns 74B, these areas may not be etched but may remain. Therefore, the remaining areas may form first insulating patterns 73A located in the second openings OP2, respectively. The first insulating patterns 73A may surround the second insulating patterns 74A, respectively. In addition, the first insulating pattern 73A and the second insulating pattern 74A formed in the same second opening OP2 may form a single loop pattern 75.

Contact plugs 76 may be formed in the first openings OP1. Though not shown in FIG. 15C, the above-described isolation patterns, slits and conductive layers may be formed.

This embodiment is described with respect to the case in which each of the loop patterns 75 includes two layers. However, the loop pattern 75 may have a multilayer structure including three or more layers. In addition, in this embodiment, methods of forming the contact plugs and the spacers in accordance with the embodiments described with reference to FIGS. 2D and 3D are described. However, the manufacturing methods may be changed with reference to other embodiments.

Figure 16:
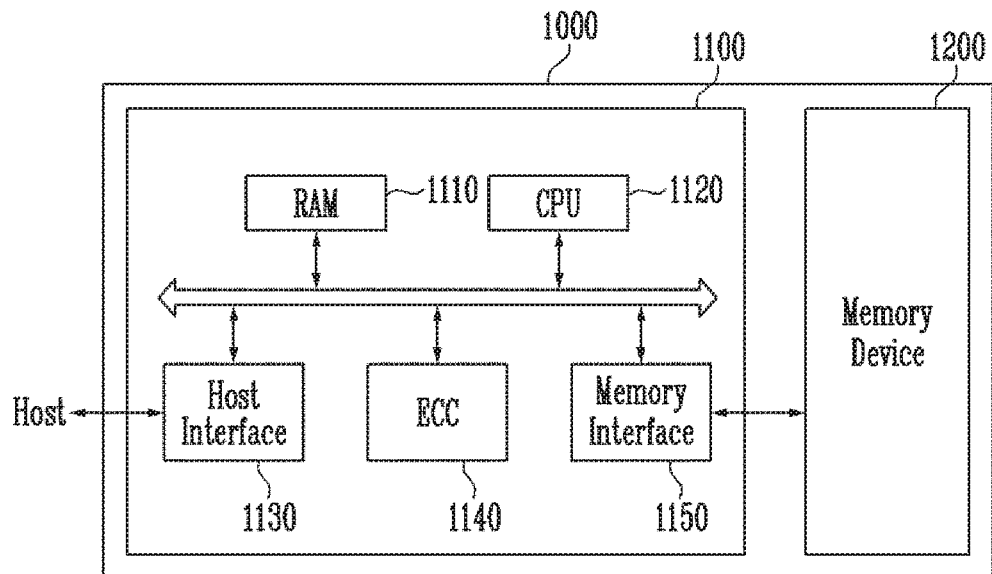
FIGS. 16 and 17 are block diagrams illustrating the configuration of a memory system in accordance with an embodiment.

FIG. 16 is block diagram illustrating the configuration of a memory system 1000 in accordance with an embodiment.

Referring to FIG. 16, the memory system 1000 may include a memory device 1200 and a controller 1100.

The memory device 1200 may be used to store various types of data such as text, graphic, and software code. The memory device 1200 may be a non-volatile memory device. In addition, the memory device 1200 may include the above configuration described with reference to FIGS. 1A to 15C, and may be manufactured by the method described with reference to FIGS. 1A to 15C. In accordance with an embodiment, the memory device 1200 may include a wiring structure, a stacked structure formed over the wiring structure, channel structures passing through the stacked structure, contact plugs passing through the stacked structure and electrically connected to the wiring structure, and insulating spacers each including loop patterns surrounding a sidewall of each of the contact plugs and stacked along the sidewall of the respective contact plug. Since the memory device 1200 is configured and manufactured in the same manner as described, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data, which is read from the memory device 1200, by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data externally transferred through the host interface 1130, or temporarily store data transferred from the memory device 1200 through the memory interface 1150. The controller 1100 may further include ROM storing code data to interface with the host.

Since the memory system 1000 in accordance with the embodiment includes the memory device 1200 having improved integration density and characteristics, the memory system 1000 may also have improved integration density and characteristics accordingly.

Figure 17:
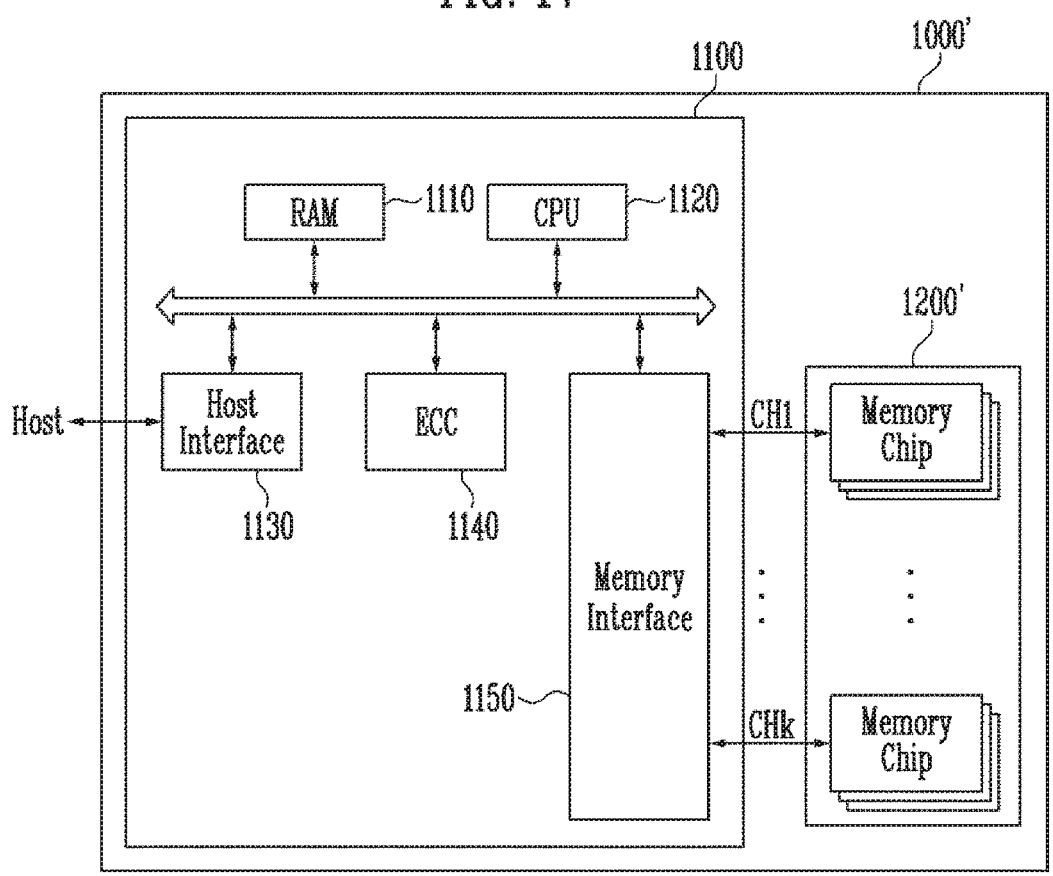

FIG. 17 is block diagram illustrating the configuration of a memory system 1000' in accordance with an embodiment. Hereinafter, any repetitive detailed description of components already mentioned above will be omitted.

As illustrated in FIG. 17, the memory system 1000' may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. In addition, the memory device 1200 may include the above configuration described with reference to FIGS. 1A to 15C, and may be manufactured by the method described with reference to FIGS. 1A to 15C. In accordance with an embodiment, the memory device 1200' may include a wiring structure, a stacked structure formed over the wiring structure, channel structures passing through the stacked structure, contact plugs passing through the stacked structure and electrically connected to the wiring structure, and insulating spacers each including loop patterns surrounding a sidewall of each of the contact plugs and stacked along the sidewall of the respective contact plug. Since the memory device 1200' is configured and manufactured in the same manner as described, a detailed description thereof will be omitted.

The memory device 1200' may be a multi-chip package composed of a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. The memory system 1000' may be modified so that a single memory chip may be coupled to a single channel.

As described above, in accordance with the embodiment, since the memory system 1000' includes the memory device 1200' having improved integration and characteristics, integration density and characteristics of the memory system 1000' may also be improved. In addition, since the memory device 1200' is formed using a multi-chip package, data storage capacity and driving speed of the memory system 1000' may be further increased.

Figure 18:
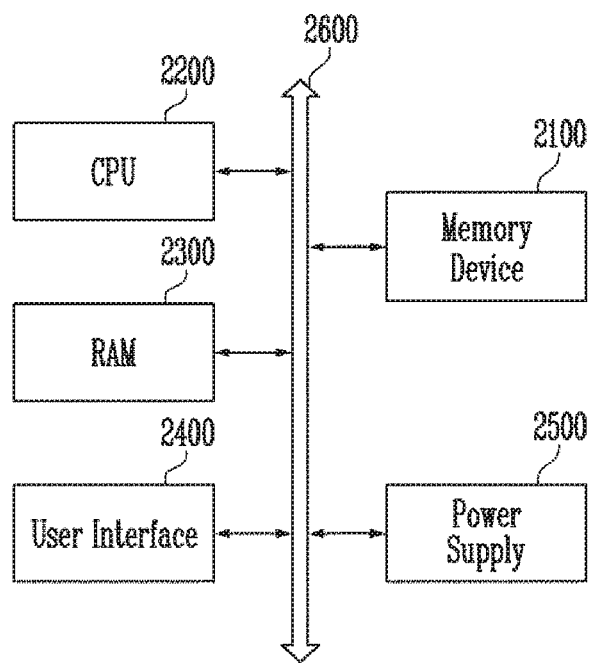
FIGS. 18 and 19 are block diagrams illustrating the configuration of a computing system in accordance with an embodiment.

FIG. 18 is a block diagram illustrating a computing system 2000 in accordance with an embodiment. Hereinafter, any repetitive detailed description of components already mentioned above will be omitted.

As illustrated in FIG. 18, the computing system 2000 may include a memory device 2100, a CPU 2200, a random-access memory (RAM) 2300, a user interface 2400, a power supply 2500 and a system bus 2600.

The memory device 2100 may store data entered through the user interface 2400, and data, which is processed by the CPU 2200. The memory device 2100 may be electrically coupled to the CPU 2200, the RAM 2300, the user interface 2400, and the power supply 2500. For example, the memory device 2100 may be coupled to the system bus 2600 through a controller (not illustrated) or be directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may include the above configuration described with reference to FIGS. 1A to 15C, and may be manufactured by the method described with reference to FIGS. 1A to 15C. In accordance with an embodiment, the memory device 2100 may include a wiring structure, a stacked structure formed over the wiring structure, channel structures passing through the stacked structure, contact plugs passing through the stacked structure and electrically connected to the wiring structure, and insulating spacers each including loop patterns surrounding a sidewall of each of the contact plugs and stacked along the sidewall of the respective contact plug. Since the memory device 2100 is configured and manufactured in the same manner as described, a detailed description thereof will be omitted.

In addition, as described above with reference to FIG. 17, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audiorecorder, a digital audioplayer, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 in accordance with an embodiment includes the memory device 2100 having improved integration density and characteristics, characteristics of the computing system 2000 may also be improved.

Figure 19:
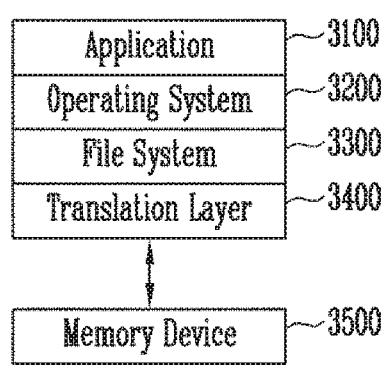

FIG. 19 is a block diagram illustrating a computing system 3000 in accordance with an embodiment.

As illustrated in FIG. 19, the computing system 3000 in accordance with an embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 17 illustrates the operating system 3200, the application 3100, and the file system 3300 in separate blocks. However, the application 3100 and the file system 3300 may be included in the operating system 3200.

The translation layer 3400 may translate an address so as to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. In addition, the memory device 3500 may include the above configuration described with reference to FIGS. 1A to 15C, and may be manufactured by the method described with reference to FIGS. 1A to 15C. in accordance with an embodiment, the memory device 3500 may include a wiring structure, a stacked structure formed over the wiring structure, channel structures passing through the stacked structure, contact plugs passing through the stacked structure and electrically connected to the wiring structure, and insulating spacers each including loop patterns surrounding a sidewall of each of the contact plugs and stacked along the sidewall of the respective contact plug. Since the memory device 3500 is configured and manufactured in the same manner as described, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 in accordance with an embodiment includes the memory device 3500 having improved integration density and characteristics, characteristics of the computing system 3000 may also be improved.

In accordance with various embodiments of the invention, a semiconductor device having an improved stabilized structure and improved reliability may be provided. In addition, a simplified, more efficient and economical method of manufacturing a semiconductor device is provided.

It will be apparent to those skilled in the art that various modifications can be made to the above-described exemplary embodiments of the present invention without departing from the spirit or scope of the invention. Thus, it is intended that the present invention cover all such embodiments and modifications thereof which fall within the scope of the present invention as defined by the appended claims including equivalents thereof

What is claimed is:

1. A method of manufacturing a semiconductor device, the method comprising:
    forming a wiring structure in an interlayer insulating layer;
    forming a stacked structure including first material layers and second material layers stacked alternately with each other on the wiring structure;
    forming first openings passing through the stacked structure;
    forming second openings by partially etching each of the first material layers through the first openings;
    forming insulating spacers each including loop patterns located in the second openings; and
    forming contact plugs electrically coupled to the wiring structure in the first openings,
    wherein the loop patterns surround sidewalk of the contact plugs which are electrically coupled to a peripheral circuit through the wiring structure.

2. The method of claim 1, wherein each of the insulating spacers includes the loop patterns in the second openings and a coupling pattern in each of the first openings.

3. The method of claim 1, wherein the forming of the insulating spacers comprises:
    forming an insulating layer in the first and second openings; and
    forming the loop patterns by etching the insulating layer using a dry cleaning process.

4. The method of claim 1, wherein the forming of the insulating spacers comprises:
    forming a first insulating layer in the first and second openings;
    forming second insulting patterns located in the second openings, respectively; and
    forming first insulating patterns located in the second openings, respectively, by etching the first insulating layer using the second insulating patterns as an etch barrier.

5. The method of claim 1, wherein the forming of the second openings comprises controlling an etch depth of the first material layers so that neighboring first openings are coupled to each other.

6. The method of claim 1, wherein the forming of the second openings comprises controlling an etch depth of the first material layers so that neighboring first openings are separated from each other.

7. A method of manufacturing a semiconductor device, the method comprising:
    forming a wiring structure;
    forming a stacked structure including first material layers and second material layers stacked alternately with each other on the wiring structure;
    forming first openings passing through the stacked structure;
    forming second openings by partially etching the first material layers exposed through the first openings;
    forming insulating spacers each including loop patterns located in the second openings;
    forming contact plugs electrically coupled to the wiring structure in the first openings; and
    forming an isolation pattern partially passing through the stacked structure and extending in one direction,
    wherein the isolation pattern is coupled to the insulating spacers.

8. A method of manufacturing a semiconductor device, the method comprising:
    forming an interconnection structure in an interlayer insulating layer;
    forming a stacked structure over the interlayer insulating layer;
    forming first openings passing through the stacked structure;
    forming second openings, wherein the second openings are coupled to each of the first openings and protruding from sidewalk of the first openings;
    forming spacers each including loop patterns filling the second openings; and
    forming plugs in the first openings,
    wherein the second openings of neighboring first openings are coupled to each other, and
    wherein the loop patterns surround sidewalk of the plugs which are electrically coupled to a peripheral circuit through the interconnection structure.

9. The method of claim 8, wherein the forming of the spacers comprises forming the loop patterns filling the second openings, respectively, and a coupling pattern in the first openings.

10. The method of claim 8, wherein the forming of the spacers comprises:
    forming an insulating layer in the first and second openings; and
    forming the loop patterns filling the second openings, respectively, by etching the insulating layer using a dry cleaning process.

11. The method of claim 8, wherein the forming of the spacers comprises:
    forming a first insulating layer in the first and second openings;
    forming second insulating patterns in the second openings, respectively; and
    forming first insulating patterns located in the second openings, respectively, by etching the first insulating layer using the second insulating patterns as an etching barrier.

12. The method of claim 8, wherein the stacked structure includes first material layers and second material layers stacked alternately with each other, and the second openings are formed by selectively etching the first material layers exposed through the first openings.

13. The method of claim 8, wherein the interconnection structure includes wires and contact plugs.

14. The method of claim 8, wherein loop patterns of neighboring spacers are coupled to each other.

15. The method of claim 1, wherein the contact plugs are formed after the insulating spacers are formed.

\* \* \* \* \*